United States Patent
Ito et al.

(10) Patent No.: US 6,730,447 B2
(45) Date of Patent: May 4, 2004

(54) MANUFACTURING SYSTEM IN ELECTRONIC DEVICES

(75) Inventors: Shinichi Ito, Yokohama (JP); Tatsuhiko Higashiki, Fujisawa (JP); Hiroshi Ikegami, Hiratsuka (JP); Nobuo Hayasaka, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 10/092,486

(22) Filed: Mar. 8, 2002

(65) Prior Publication Data

US 2002/0136971 A1 Sep. 26, 2002

(30) Foreign Application Priority Data

Mar. 9, 2001 (JP) .......... 2001-067304
Mar. 9, 2001 (JP) .......... 2001-067305

(51) Int. Cl.[7] ................ G03C 5/00
(52) U.S. Cl. .......... 430/22; 430/314; 430/327; 430/328; 430/945
(58) Field of Search .......... 430/22, 314, 313, 430/327, 328, 945

(56) References Cited

U.S. PATENT DOCUMENTS 5,057,184 A * 10/1991 Gupta et al. ............ 156/637
6,231,917 B1   5/2001 Ito et al. .............. 427/9
6,407,385 B1 * 6/2002 Okada ................. 250/306

FOREIGN PATENT DOCUMENTS

| JP | 62-252136 | 11/1987 |
| JP | 63-117421 | 5/1988 |
| JP | 2-298017 | 12/1990 |
| JP | 4-228284 | 8/1992 |
| JP | 5-3143 | 1/1993 |
| JP | 5-198496 | 8/1993 |
| JP | 7-161623 | 6/1995 |
| JP | 8-220559 | 8/1996 |
| JP | 10-113779 | 5/1998 |
| JP | 11-145108 | 5/1999 |
| JP | 2001-15407 | 1/2001 |

OTHER PUBLICATIONS

Copy of U.S. patent application of Hiroshi Ikegami et al., Ser. No. 09/817,196, filed Mar. 27, 2001.
Copy of U.S. patent application Ser. No. 09/983,683, filed Oct. 25, 2001, to Ikegami et al.

* cited by examiner

*Primary Examiner*—Christopher G. Young
(74) *Attorney, Agent, or Firm*—Finnegan, Henderson, Farabow, Garrett & Dunner, L.L.P.

(57) ABSTRACT

A laser processing apparatus comprises a laser oscillator for producing a laser beam to selectively remove part of a substrate to be processed, a scanning system for applying the laser beam to an arbitrary position of the substrate and incident means for applying the laser beam to the substrate substantially at right angle.

29 Claims, 20 Drawing Sheets

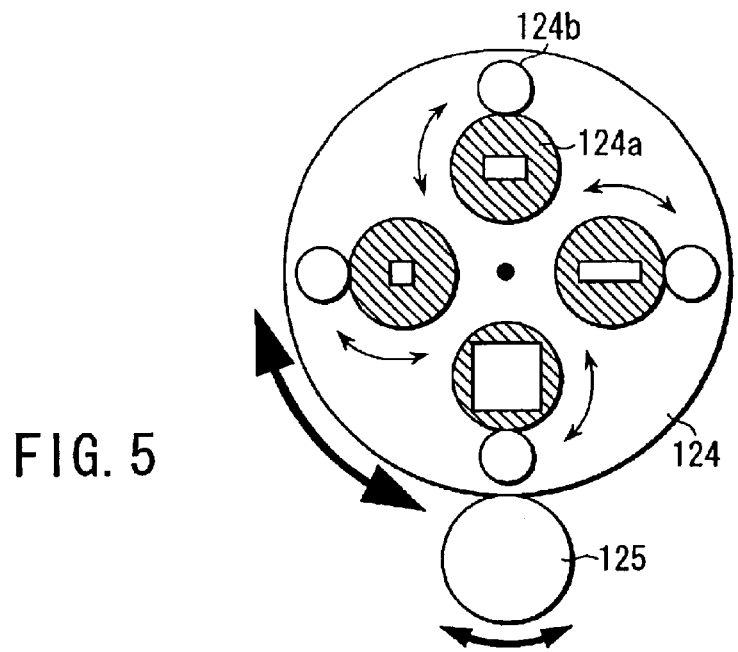
FIG. 5
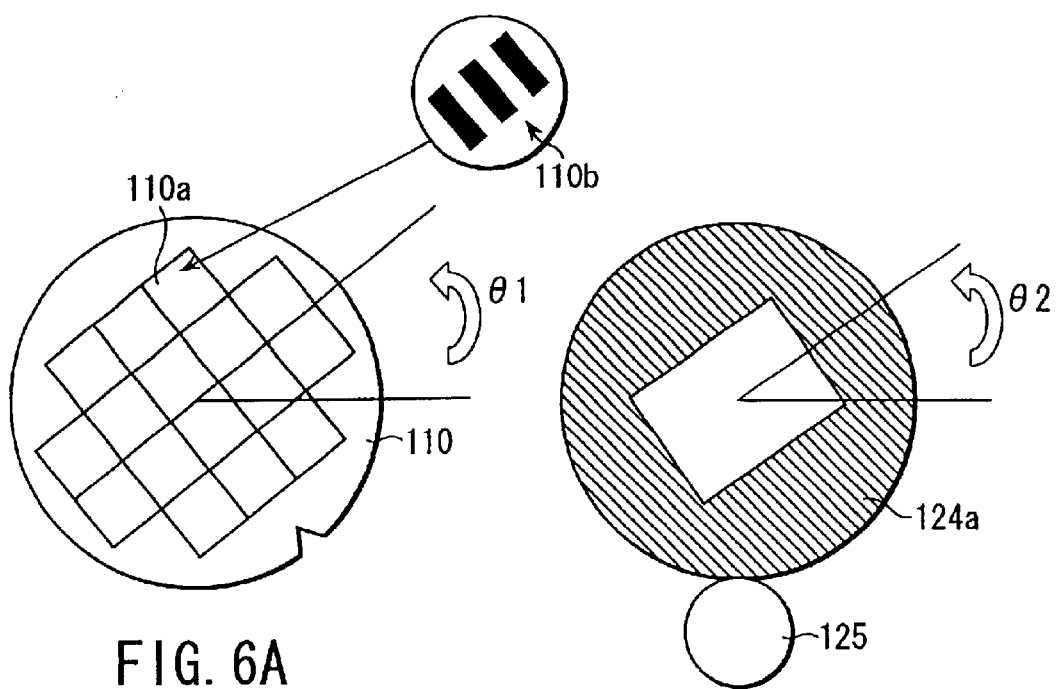
FIG. 6A
FIG. 6B

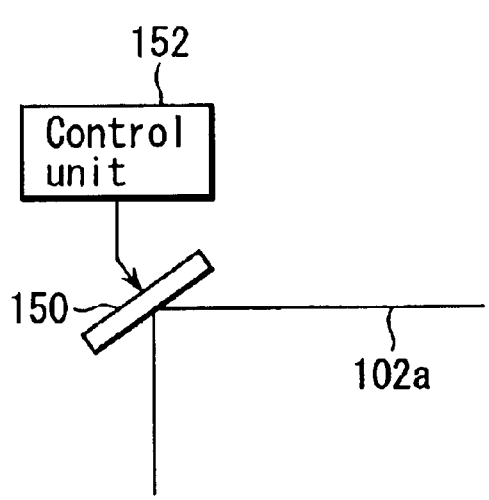
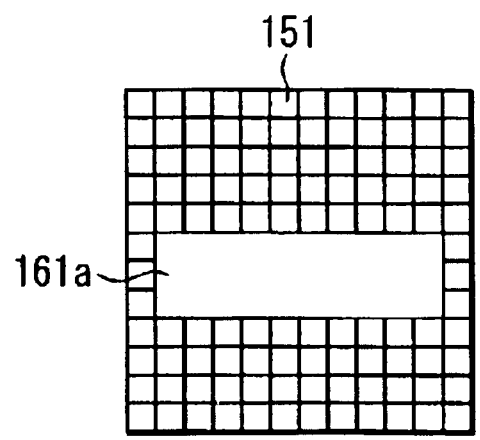
FIG. 11    FIG. 12A
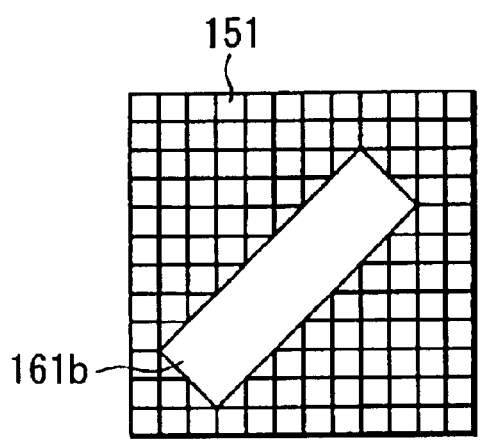
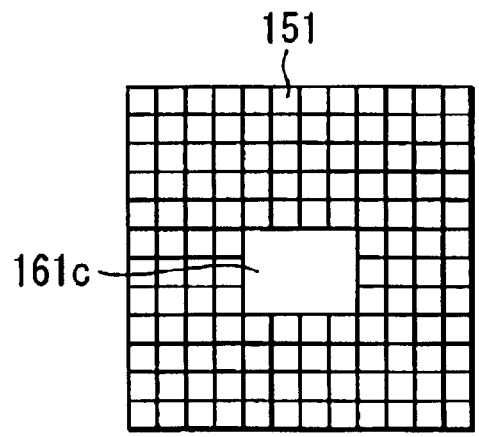
FIG. 12B    FIG. 12C

MANUFACTURING SYSTEM IN ELECTRONIC DEVICES

CROSS-REFERENCE TO RELATED APPLICATIONS

This application is based upon and claims the benefit of priority from the prior Japanese Patent Applications No. 2001-067304, filed Mar. 9, 2001; and No. 2001-067305, filed Mar. 9, 2001, the entire contents of both of which are incorporated herein by reference.

BACKGROUND OF THE INVENTION

1. Field of the Invention

The present invention relates to a processing system which includes a laser processing system, a film deposition system and a pattern forming system in order to form an electronic device such as a semiconductor device.

2. Description of the Related Art

Resist coating, exposure and development are carried out on a semiconductor wafer in a lithography process of manufacturing a semiconductor device. In this lithography process, an alignment between an upper layer pattern and a lower layer pattern are accomplished to carry out the pattern exposure. Generally, an exposure apparatus is employed for this pattern exposure.

The exposure apparatus is provided with an alignment mechanism for detecting a position of the lower layer pattern. The alignment mechanism computes a position for exposing the upper layer pattern by detecting a position of an alignment mark disposed on the lower layer pattern. After the lithography process is finished, an alignment error detection is carried out for detecting the alignment error between the lower layer and the upper layer pattern. For the alignment error detection, an error detection mark is disposed. The alignment error detector measures the position of this error detection mark. Generally, the alignment detection and the error detection are carried out by optical position detection. The alignment mark and the error detecting mark may be sometimes provided each having low-transparency film, which are formed over those films, in order to pass the same processing steps as the semiconductor integrated circuit. Thus, if the low-transparency film is formed on the mark, the alignment mark and the error detection mark are difficult to recognize. For the reason, it is required for removing that low-transparency film formed over the alignment mark.

However, a conventional laser processing apparatus cannot remove the low-transparency film on the mark accurately, so that a region not desired to be removed may be sometimes removed, which is a problem to be solved.

Further, deterioration of the alignment accuracy upon exposure is a problem in the aforementioned lithography process. This is because a resist is formed asymmetrically due to an unevenness or roughness of the underlying layer. To eliminate this problem, Jpn. Pat. Appln. KOKAI Publication Nos. 62-252136, 63-117421 and 2-298017 have disclosed, which describe means for processing the resist film such as a light sensitive film with a laser beam.

However, the aforementioned problem has been eliminated because the processing surface (mainly $SiO_2$ film) is planarized by mean of chemical mechanical polishing (CMP) in recent years. However, if patterning is carried out on a resist film formed on the substrate, there is produced such a problem that pattern deterioration occurs accompanied by standing wave. The standing wave is produced by an interference between a light reflected from a reflecting surface of metal or polysilicon after exposure light passes through the resist film and then oxide film. Thus, a reflection protecting film for preventing reflection of the exposure light from the underlying layer is used under the resist film in order to prevent such standing wave which may be generated in the resist film. However, because the reflection protecting film is formed, it becomes difficult that observation of the alignment mark necessary for detecting the positional information of the pattern on a processing substrate upon exposure. Particularly, alignment performed through a mask and lens using the exposure light as alignment light, which system has been adopted recently in order to achieve high accuracy positional information detection, has such a problem that the alignment mark cannot be seen because of the reflection protecting film. Jpn. Pat. Appln. KOKAI Publication No. 2001-15407 has disclosed a method of processing and removing this reflection protecting film with laser.

Removal of an organic film with laser beam has been disclosed in Jpn. Pat. Appln. KOKAI Publication Nos. 62-252136, 63-117421, 2-298017, 5-3143, 5-198496, 7-161623, and 10-113779 and the like. According to all these disclosed arts, the organic film is evaporated by irradiating a processing film directly with laser beam. There is such a problem that foreign materials (unburnt organic film residue) generated at that time exist diffusingly in the vicinity of the processing region thereby producing a defect and failure. Further, there is another problem that a processing portion boundary is swollen by heat generated upon the laser processing.

The conventional laser processing apparatus is incapable of removing opaque film on the mark accurately. Consequently, a region not desired to be removed is also removed or when removing organic film or inorganic film existing on a region containing the alignment mark by irradiation of the energy beam such as the laser beam, foreign materials are scattered around the removal region thereby inducing the defect or failure. Therefore, there have been demanded a laser processing apparatus capable of removing only the removal region when irradiating a substrate to be processed with a laser beam and a laser processing system capable of suppressing damage in the vicinity of an energy beam irradiation region on a surface of the substrate to reduce generation of scattered substance accompanied by irradiation with the energy beam.

BRIEF SUMMARY OF THE INVENTION

According to an aspect of the present invention, there is provided a laser processing apparatus, which comprises a laser oscillator for producing a laser beam for selectively removing part of a substrate to be processed; a scanning system for applying the laser beam to an arbitrary position of the substrate; and incident means for applying the laser beam to the substrate substantially at right angle.

According to another aspect of the present invention, there is provided a film deposition system, which comprises a carrier station for holding one or more substrates to be processed; coating film forming means for supplying a coating film forming chemical containing a solvent to a main surface of the substrate to form a coating film on the main surface; removing the solvent contained in the coating film to form a film on the main surface; laser processing means for applying an energy beam to the main surface from an energy irradiation device to remove selectively at least part of the film from the main surface; and carrying means, connected to the carrier station, coating film forming means, coating film forming means and laser processing means, for carrying in and out the substrate.

According to still another aspect of the present invention, there is provided a pattern forming system, which comprises a carrier station for holding one or more substrate to be processed the substrate having an alignment mark in a main surface thereof; first film forming means for forming a first thin film on the main surface; first coating film forming means for forming a coating film on the first thin film by supplying a coating film forming chemical containing both a sensitive material and a solvent to the main surface; second coating film forming means for forming a light sensitive thin film by removing the solvent contained in the coating film formed by the first coating film forming means; laser processing means for selectively removing at least part of the light sensitive thin film and the first thin film formed on the substrate by irradiating the main surface with an energy beam from an energy irradiation device; latent image forming means for detecting a position of an alignment mark on the main surface, thereby forming a latent image in the light sensitive thin film based on positional information of the detected alignment mark; light sensitive thin film pattern forming means for forming a light sensitive thin film pattern by applying one of an etching solution and an etching gas to a surface of the light sensitive thin film to remove at least part of the light sensitive thin film selectively; and carrying means, connected to the carrier station, the coating thin film forming means, the coating thin film forming means and laser processing means, for carrying the substrate.

According to a further aspect of the present invention, there is provided a method of manufacturing a semiconductor device, which comprises forming a first thin film on a main surface of a semiconductor substrate having an alignment mark; applying a first energy beam to the first thin film provided on a region containing the alignment mark to selectively remove part of the first thin film; supplying a chemical containing both a light sensitive material and a solvent onto the first thin film to provide a coating film thereon; removing the solvent contained in the coating film to form a light sensitive thin film; carrying the semiconductor substrate to latent image forming means and irradiating the positioning mark with a reference beam through a region in which the first thin film is selectively removed, thereby to recognize a position of the alignment mark; irradiating a predetermined position on the light sensitive thin film with a second energy beam based on the position of the recognized alignment mark to form a latent image on the light sensitive thin film; and forming a light sensitive thin film pattern by removing at least part of the light sensitive thin film based on the latent image formed on the light sensitive thin film, wherein upon irradiating the first energy beam, liquid is supplied to at least a region irradiated with first energy beam.

According to a still further aspect of the present invention, there is provided a method of manufacturing a semiconductor device, which comprises forming a first thin film on a main surface of a semiconductor substrate having an alignment mark; supplying a chemical containing a light sensitive material and a solvent to the first thin film to form a coating film on the first thin film; forming a light sensitive film by removing the solvent contained in the coating film to provide a light sensitive film thereon; applying a first energy beam to the light sensitive film provided on a region containing the alignment mark, thereby to selectively remove the light sensitive film and part of the first thin film; recognizing a position of the alignment mark by irradiating the alignment mark with the reference light through the region in which the first thin film is selectively removed; forming a latent image on the light sensitive film by irradiating a predetermined position of the light sensitive film with a second energy beam based on the position of the recognized alignment mark; and forming a light sensitive film pattern by selectively removing part of the light sensitive thin film based on the latent image formed on the light sensitive film, wherein upon irradiating the first energy beam, a liquid is supplied to at least a region irradiated with the first energy beam.

According to a yet still further aspect of the present invention, there is provided a method of manufacturing a semiconductor device, which comprises forming a coating film by supplying a chemical containing a light sensitive material and a solvent onto a main surface of a semiconductor substrate having an alignment mark; forming a light sensitive thin film on the semiconductor substrate by removing the solvent contained in the coating film; removing selectively part of the light sensitive thin film by irradiating the light sensitive thin film on a region containing the alignment mark with a first energy beam; carrying the semiconductor substrate to latent image forming means to irradiate the alignment mark with a reference light through the region in which the light sensitive thin film is selectively removed, thereby recognizing a position of the alignment mark; forming a latent image on the light sensitive thin film by irradiating a predetermined position of the light sensitive thin film with a second energy beam based on the position of the recognized alignment mark; and forming a thin film pattern by removing selectively the thin film based on the latent image formed in the light sensitive thin film, wherein upon irradiating the first energy beam, a liquid is supplied to a region irradiated with the first energy beam.

BRIEF DESCRIPTION OF THE DRAWINGS

FIG. 5 is a diagram schematically showing an aperture plate and an aperture switching mechanism in the laser processing apparatus of the fourth embodiment of the present invention;

FIGS. 6A and 6B are diagrams for explaining an aperture rotating mechanism in the laser processing apparatus of the fourth embodiment of the present invention;

FIG. 11 is a diagram schematically showing an aperture and an aperture rotating mechanism using an optical device according to an eighth embodiment of the present invention;

FIGS. 12A to 12C are diagrams showing the optical device in FIG. 11 and a beam shape formed thereby;

DETAILED DESCRIPTION OF THE INVENTION

Hereinafter, the embodiments of the present invention will be described in detail with reference to the accompanying drawings.

Figure 1:
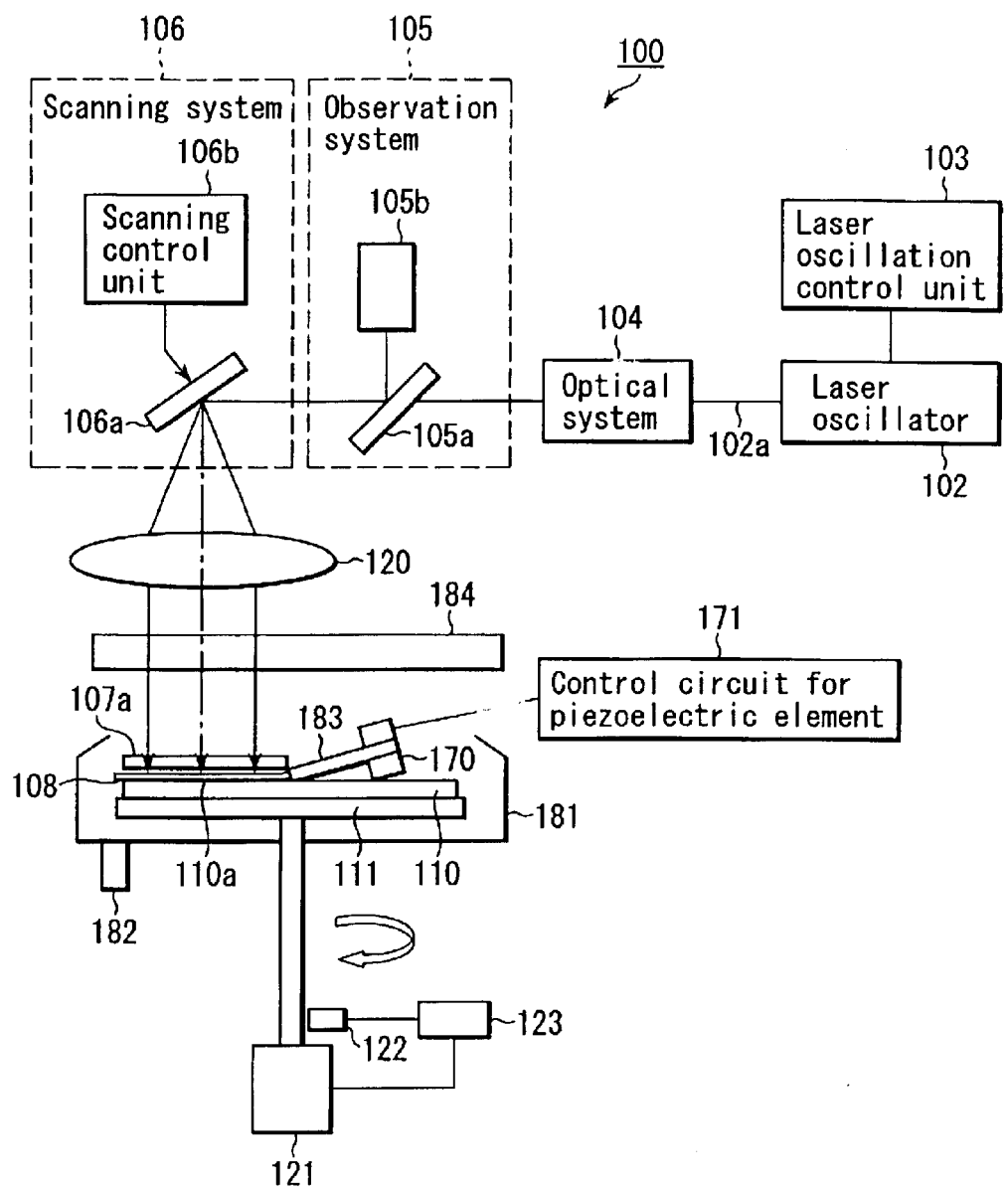
FIG. 1 is a diagram schematically showing a laser processing apparatus according to a first embodiment of the present invention.

FIG. 1 schematically shows a laser processing apparatus 100 according to a first embodiment of the present invention.

This laser processing apparatus 100 comprises a laser oscillator 102, a stage 111 capable of holding a substrate 110 to be processed thereon and a cup 181 surrounding the stage 111 on which the substrate is disposed.

The cup 181 functions for preventing a chemical supplied to the substrate from splashing. A drain 182 is provided in the bottom of the cup 181 to discharge the chemical 108.

A chemical supply nozzle 183 for supplying the chemical 108 to a surface 110a of the substrate 110 is provided. As the chemicals supplied from the chemical supply nozzle 183, liquids for use upon laser processing, highly volatile solutions for use upon removal of these liquids, solvents of resists and the like are available. The chemical supply nozzle 183 is provided with a piezoelectric element 170 and a piezoelectric element drive control circuit 171 for controlling the drive of this piezoelectric element 170.

The piezoelectric element 170 is capable of removing bubbles generated when laser beam is irradiated by applying ultrasonic vibration to at least the chemical in a laser beam irradiation region of the surface 110a of the substrate 110.

The chemical supply nozzle 183 is movable between the substrate 110 and a partition plate 184 to supply the chemical onto the main surface of the substrate. Further, a window 107a, the chemical supply nozzle 183 and the piezoelectric element 170 can be temporarily moved above the substrate.

Further, the partition plate 184 and the window 107a transparent to the laser beam include the function of protecting from splash of the chemical 108 upon laser processing and the function of protecting information from dust or the like adhering to the surface of the substrate 110.

The chemical 108 is capable of removing heat generated by laser beam irradiation in the vicinity of laser beam irradiation region from the surface 110a of the substrate 110 and reducing the momentum of evaporation generated by laser beam irradiation. As the chemicals, distilled water and ammonia water solution may be used practically. Basically, the laser beam irradiation region of the surface 110a of the substrate 110 only has to be immersed in the chemical.

This laser processing apparatus 100 further comprises a laser oscillator control unit 103 for controlling the laser oscillator 102, an optical system 104, an observation system 105 and a scanning system 106 which is moved relatively between the laser beam and the processing surface of a processing object.

In this apparatus, a Q-switch Nd YAG laser is employed as the laser oscillator 102. This laser oscillator 102 can emit any laser beam 102a of basic wave (1064 nm in wavelength), second harmonic (532 nm in wavelength), third harmonic (355 nm in wavelength) and fourth harmonic (266 nm in wavelength). Further, the pulse width of the laser beam 102a emitted from the laser oscillator 102 is set to about 10 nsec and the laser beam irradiation region can be adjusted within a range of 10 $\mu$m to 500 $\mu$m on side (10 $\mu$m×10 $\mu$m to 500 $\mu$m×500 $\mu$m) by a slit mechanism (not shown) Further, the laser beam oscillation frequency of the laser oscillator 102 is adjusted from 1 Hz to 10 kHz. Oscillation control, irradiation region control and the like on the laser beam 102a from this laser oscillator 102 are carried out by the laser oscillation control unit 103.

The laser beam 102a emitted from the laser oscillator 102 passes through the optical system 104, the observation system 105 and the scanning system 106 in succession, so that it is applied to the surface of the substrate 110. The observation system 105 comprises at least a half mirror 105a for taking the laser beam 102a from its optical axis and an observation camera 105b for observing the taken laser beam. Alignment of the laser beam irradiation position can be adjusted using this observation system 105.

The scanning system 106 comprises at least a scanning mirror 106a for moving an irradiation position of the laser beam 102a on the processing surface 110a of the substrate 110, a scanning mirror 106a for scanning with the laser beam 102a continuously and a scanning control unit 106b for controlling the drive of this scanning mirror 106a. That is, in this laser processing apparatus 100, the irradiation position of the laser beam is changed with the scanning mirror 106a of the scanning system 106. Further, a condenser lens 120 is provided between the scanning mirror 106a and the substrate 110 so that the laser beam 102a is incident substantially at right angle to the surface 110a of the substrate.

The substrate 110 is rotated by a wafer rotating mechanism 121 connected to a stage 111 and the rotation of the substrate 110 is controlled by a sensor 122 and a rotation control mechanism 123 in terms of its rotation angle. According to this embodiment, the rotating mechanism is connected to the drive control unit so as to move a holder horizontally and vertically to change the irradiation position of the laser beam.

According to this embodiment, the rotation mechanism achieves reduction in size of the condenser lens 120 and the rotation angle of the scanning mirror 106a, thereby reducing the size of the laser processing system.

Figure 2:
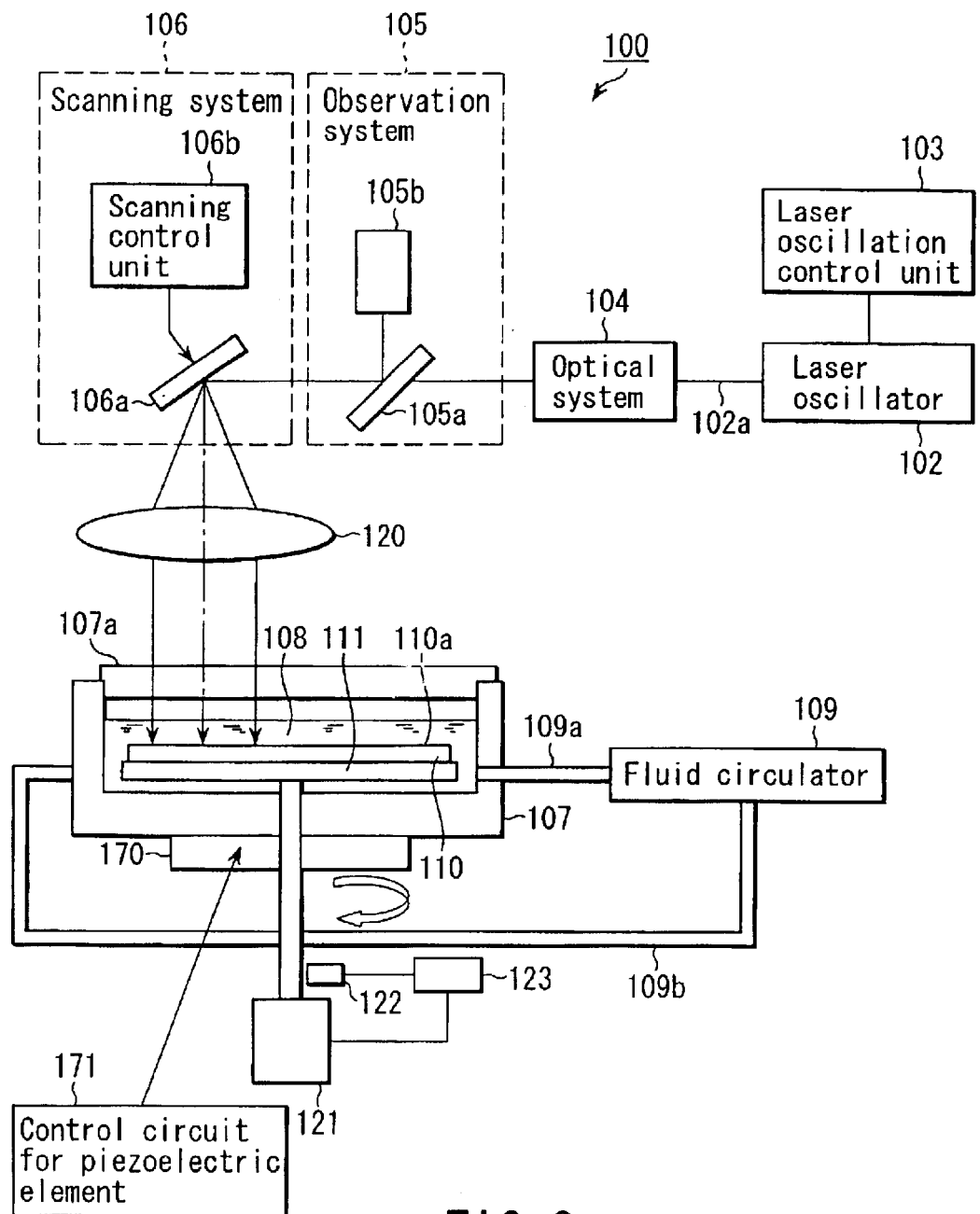
FIG. 2 is a diagram schematically showing a laser processing apparatus according to a second embodiment of the present invention.

FIG. 2 schematically shows a laser processing apparatus according to a second embodiment of the present invention. In FIG. 2, like reference numerals are attached to the same components as FIG. 1 and a description thereof is omitted.

In the laser processing apparatus 100 of the embodiment, the substrate 110 is disposed on the stage 111 rotatable in a holder 107 which stores a liquid (chemical) for immersing a laser beam irradiation region in the surface 110a.

The plan shape of the holder 107 can be changed appropriately depending on the shape of a substrate to be disposed. For example, if a disc-like substrate such as a semiconductor wafer is disposed, a circular shaped holder in plan may be used. If a rectangular processing object such as a quartz glass substrate for use in a liquid crystal display device or printed wiring substrate is disposed, a rectangular shaped holder in plan may be used. Of course, it is permissible to dispose a disc like processing object such as the semiconductor wafer on the rectangular shaped holder.

The holder 107 has the window 107a transparent to laser beam and covers the liquid immersing the processing object and at least its processing surface. The laser beam 102a produced from the laser oscillator 102 passes through the window 107a and the liquid 108 and then is irradiated on the surface 110a of the substrate 110. The window 107a has at least function of protecting from splash of the liquid 108 stored in the holder 107 upon laser processing and function of protecting information from dust or the like adhering to the surface of the substrate 110.

The liquid 108 can take the heat from the surface 110a of the substrate 110 when the laser beam is irradiated in the laser beam irradiation region and reduce the momentum of evaporation generated because of irradiation of the laser beam. As the liquid, distilled water and ammonia water solution may be used practically. Basically, a laser beam irradiation region on the surface 110a of the substrate 110 only has to be immersed in the liquid. The substrate is entirely immersed in the liquid in order to deprive the surface of much heat and reduce the momentum of evaporation.

The laser processing apparatus 100 comprises a liquid circulating unit 109 for circulating the liquid 108 stored in the holder 107. The liquid circulating unit 109 is basically a pump, which is connected to the holder 107 through an intake pipe 109a and an outlet pipe 109b in order to circulate the liquid 108. That is, the liquid circulating unit 109 provides the liquid 108 stored in the holder 107 with a flow for removing bubbles generated in the laser beam irradiation region due to irradiation of the laser beam continuously so as to circulate the liquid at a constant velocity in a specific direction without generating irregular disturbance in the laser beam. The liquid circulating unit 109 is driven at least when laser processing is actually carried out.

The apparatus further includes the piezoelectric element 170 disposed on a rear face of the holder 107 and the piezoelectric element drive control circuit 171 for controlling the driving of this piezoelectric element 170. The piezoelectric element 170 applies ultrasonic vibration to at least the liquid 108 existing in the laser beam irradiation region on the surface 110a of the substrate 110 to remove bubbles generated by the irradiation of laser beam.

Figure 3:
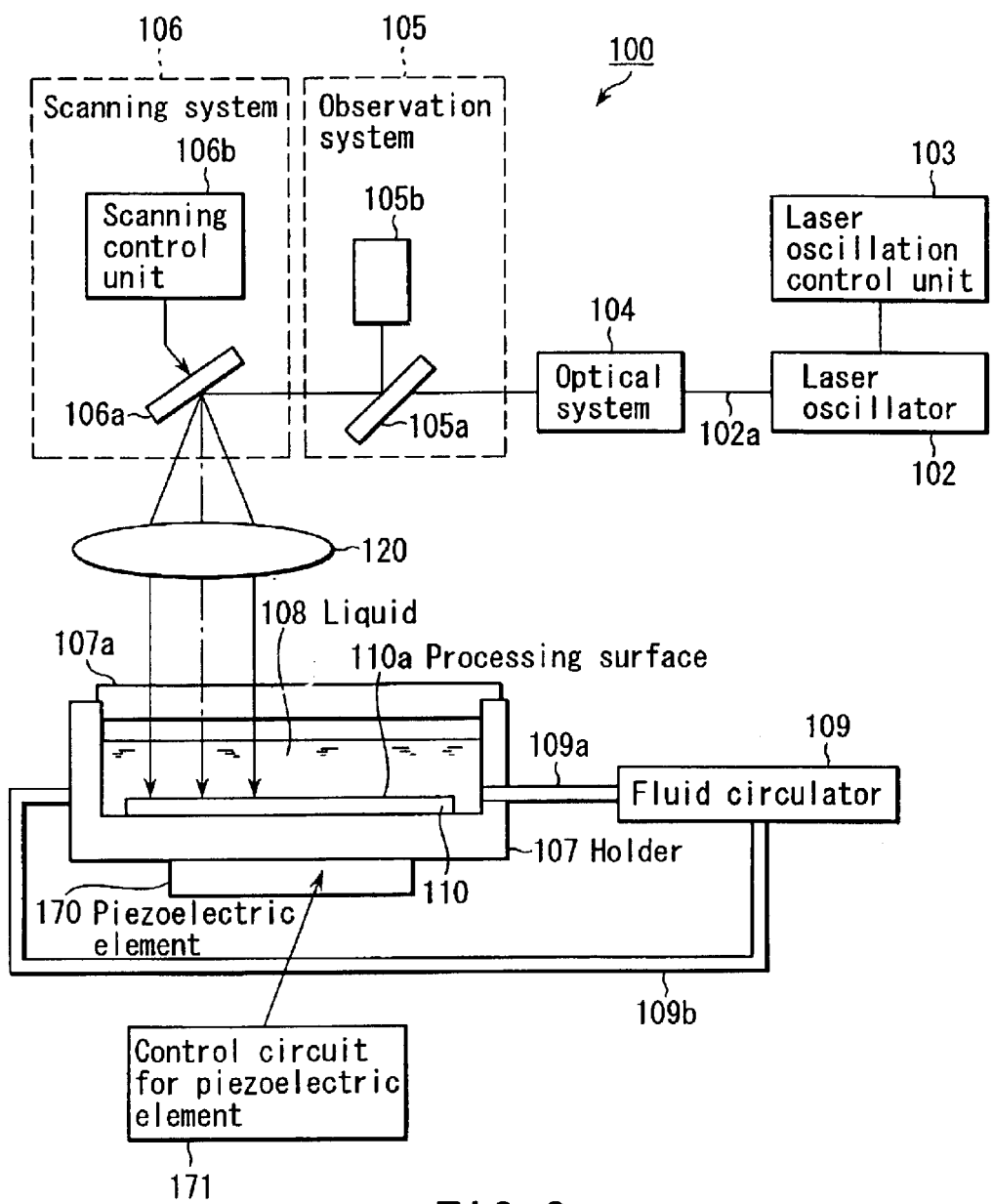
FIG. 3 is a diagram schematically showing a laser processing apparatus according to a third embodiment of the present invention.

FIG. 3 schematically shows a laser processing apparatus according to a third embodiment of the present invention. In FIG. 3, like reference numerals are attached to the same components as FIG. 2.

In the laser processing apparatus 100 of this embodiment, the substrate 110 is disposed directly on the holder 107 which stores the liquid for immersing the laser beam irradiation region of the processing surface 110a without being rotated.

The holder 107 is so configured in the form of a tray including a dam for storing the liquid, having dam wall around while holding the substrate in the center thereof. Like the second embodiment, the shape of the holder 107 in plan may be changed appropriately depending on the shape of the substrate to be placed.

In the meantime, it is permissible to use an optical beam scanning device employing an acoustic optical element such as an acoustic optical modulation element or an acoustic optical deflecting element based on acoustic optical effect instead of using a glass as the scanning system. If the acoustic optical element is employed as the scanning system, the size of the scanning system can be reduced as compared to a method of scanning the surface of the substrate by changing the direction of the glass mechanically. For example, Jpn. Pat. Appln. KOKAI Publication No. 10-83002 has disclosed a scanning system using the acoustic optical element.

Figure 4:
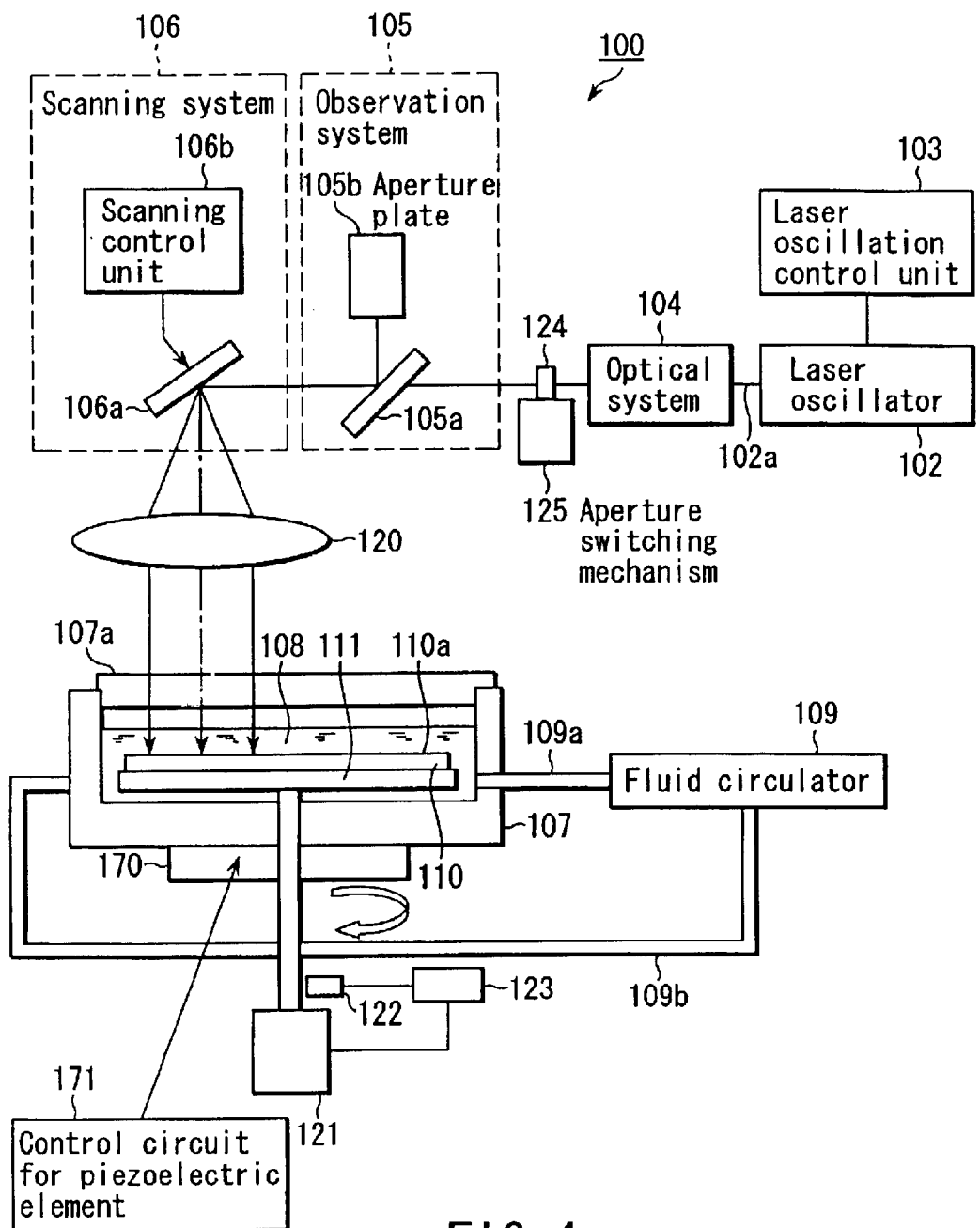
FIG. 4 is a diagram schematically showing a laser processing apparatus according to a fourth embodiment of the present invention.

FIG. 4 schematically shows a laser processing apparatus according to a fourth embodiment of the present invention. In FIG. 4, like reference numerals are attached to the same components as FIG. 2.

That is, the laser processing apparatus 100 of this embodiment is provided with an aperture plate 124 in which a plurality of apertures are formed to provide the laser beam 102a in a predetermined size and shape. The aperture plate 124 can be replaced with an arbitrary aperture through an aperture switching mechanism 125. As shown in FIG. 5, the aperture plate 124 has an aperture rotating mechanism 124b for rotating each aperture 124a by θ2 each in synchronous with a rotation angle θ1 of the substrate 110. The rotation angle of this aperture rotating mechanism 124b is synchronous with the rotation angle of the substrate 110.

The reason why this aperture rotating mechanism 124b is necessary will be described with reference to FIG. 6A. An alignment mark and the like are disposed in a wafer. If the substrate 110 is rotated by, for example, an angle θ1, the alignment mark 110b formed in each chip 110a of the substrate 110 is also rotated. Unless the aperture 124a is rotated by an angle θ2 to change the shape of laser beam to be irradiated depending upon the rotation of the substrate 110 (alignment mark 110b) as shown in FIG. 6B, a film on the alignment mark 110b cannot be removed. An irradiation position to the mark is controlled by the scanning system 106 according to preliminarily inputted mark coordinates.

Figure 7:
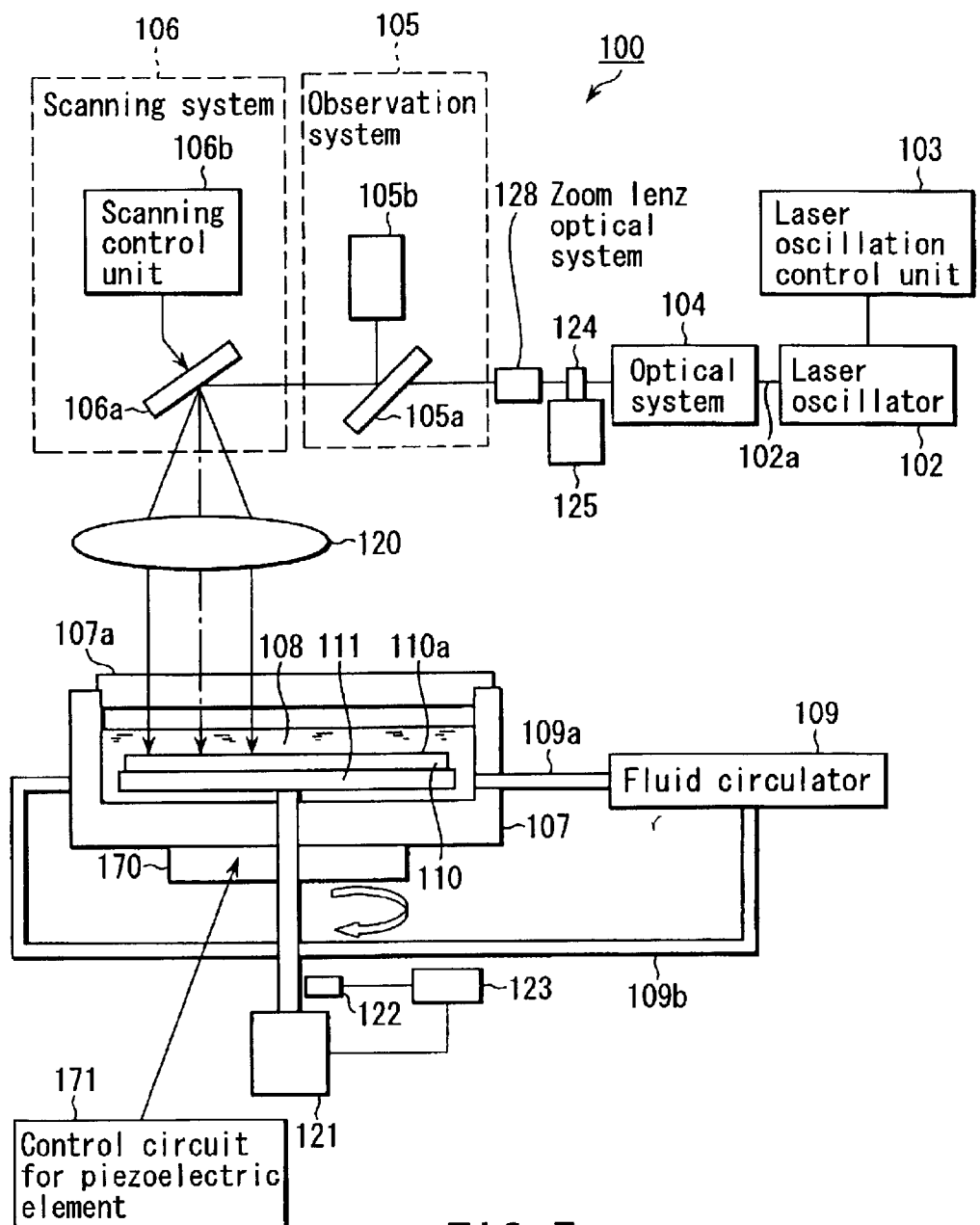
FIG. 7 is a diagram schematically showing a laser processing apparatus according to a fifth embodiment of the present invention.

FIG. 7 schematically shows a laser processing apparatus according to a fifth embodiment of the present invention. In FIG. 7, like reference numerals are attached to the same components as FIG. 2.

That is, the laser processing apparatus 100 of this embodiment is provided with a zoom lens optical system 128 for enlarging/reducing the size of beam after through the aperture plate 124.

According to the fourth embodiment, the size and shape of laser beam are changed by the aperture 124a disposed on the aperture plate 124. Although the number of the apertures which can be installed on the aperture plate 124 is limited, according to this embodiment, the size and number of laser beam which can be formed, can be increased because the zoom lens optical system 128 for changing the size of the laser beam is provided.

Figure 8:
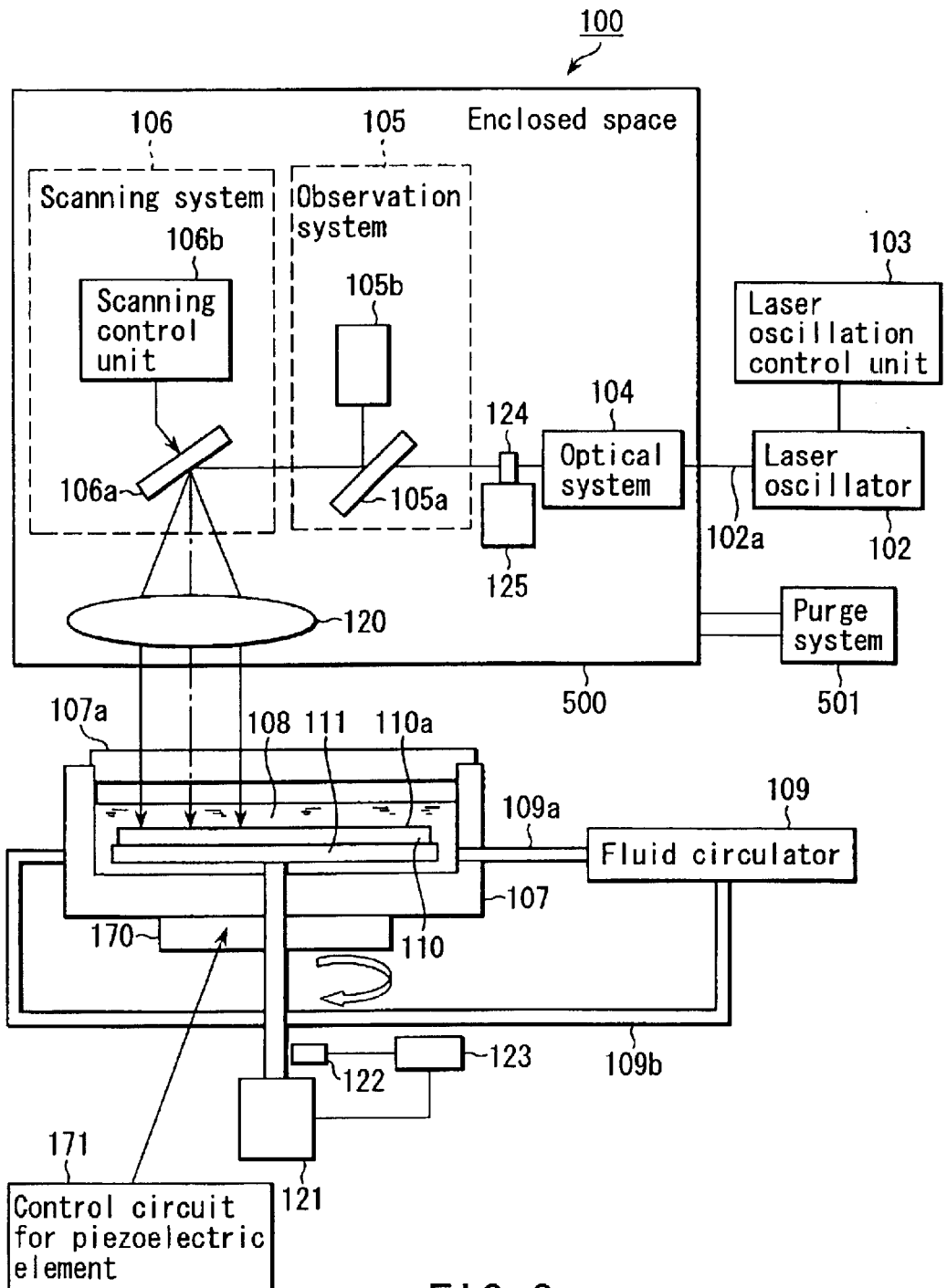
FIG. 8 is a diagram schematically showing a laser processing apparatus according to a sixth embodiment of the present invention.

FIG. 8 schematically shows a laser processing apparatus according to a sixth embodiment of the present invention. In FIG. 8, like reference numerals are attached to the same components as FIG. 2 and a description thereof is omitted.

This apparatus comprises the optical system 104 including optical members (prism, mirror and the like) for reflecting or passing laser beam, the aperture 124, the observation system 105, the scanning system 106 and the condenser lens 120, provided in an enclosed space 500. The enclosed space 500 is purged with purge gas such as $N_2$ supplied from a purge system 500.

Chemical contamination floating near the optical system produces photo-chemical reaction with the laser beam to produce unwanted clouding. According to this embodiment, the optical member is purged to protect from the unwanted clouding.

The laser processing apparatus is not restricted to the above-described embodiments. For example, the means for applying laser beam substantially at right angle to the substrate may be so constructed to apply the laser beam to an optical fiber in which the emitting beam is incident substantially at right angle to a main surface of the substrate and move the optical fiber relatively to the substrate in order to irradiate the laser beam to an arbitrary position of the substrate.

A pattern forming system including the laser processing apparatus according to the seventh embodiment of the present invention will be described.

Figure 9:
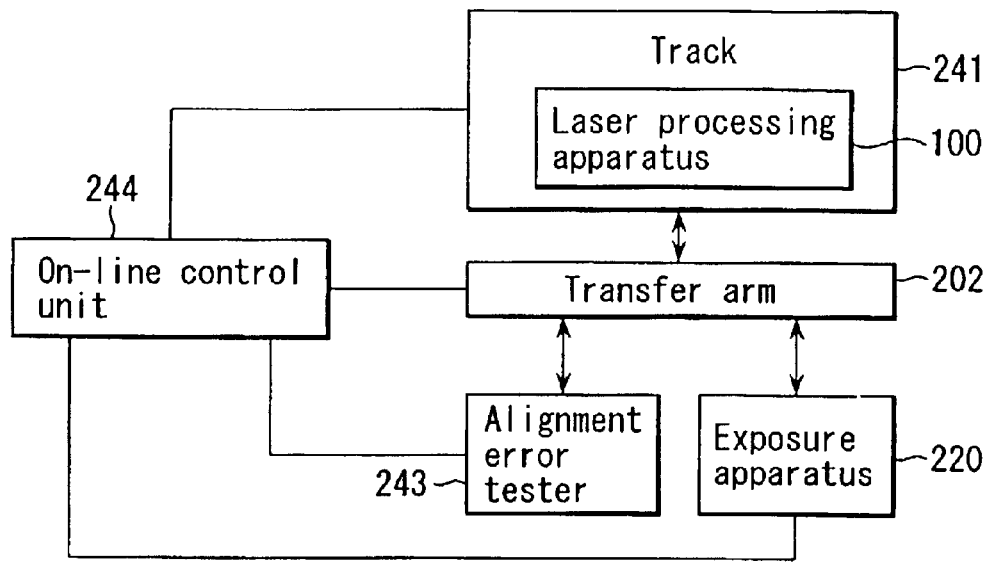
FIG. 9 is a diagram schematically showing a configuration of a pattern forming system according to a seventh embodiment of the present invention.

FIG. 9 is a block diagram schematically showing the aforementioned pattern forming system.

As shown in FIG. 9, a resist or the like is applied to a main surface of the processing substrate with a track 241. After the resist is applied, the resist film and insulating film on the mark are removed by a laser processing apparatus 208 provided in the track 241. After that, the substrate is carried to an exposure apparatus 220 by a substrate carrying machine such as a transfer arm 202, and is then exposed. After the exposure, the substrate is carried to the track 241 by the transfer arm 202 to carry out the development processing on the resist film. After the development processing is carried out, the substrate is carried to an alignment error tester 243 by the carrying machine 202 detect the error between the error test mark (reflection mark) and the formed pattern.

The laser processing apparatus 100, the exposure apparatus 220 and the error tester 243 are connected to each other through an on-line control unit 244 and an on-line interface. When computing mark coordinates for the laser processing apparatus to laser-process the alignment mark and alignment error mark (overlay measurement mark), coordinate information such as wafer coordinates, alignment mark position and error mark position can be obtained from the exposure apparatus 220 or the error tester (overlay measurement tool) 243. Of course, the mark coordinate may be input directly to the laser processing apparatus.

As shown in the present system, since the laser processing apparatus 100 is disposed in the track 241, continuous process of resist coating, laser processing and exposure is achieved, whereby the processing time can be reduced.

Figure 10:
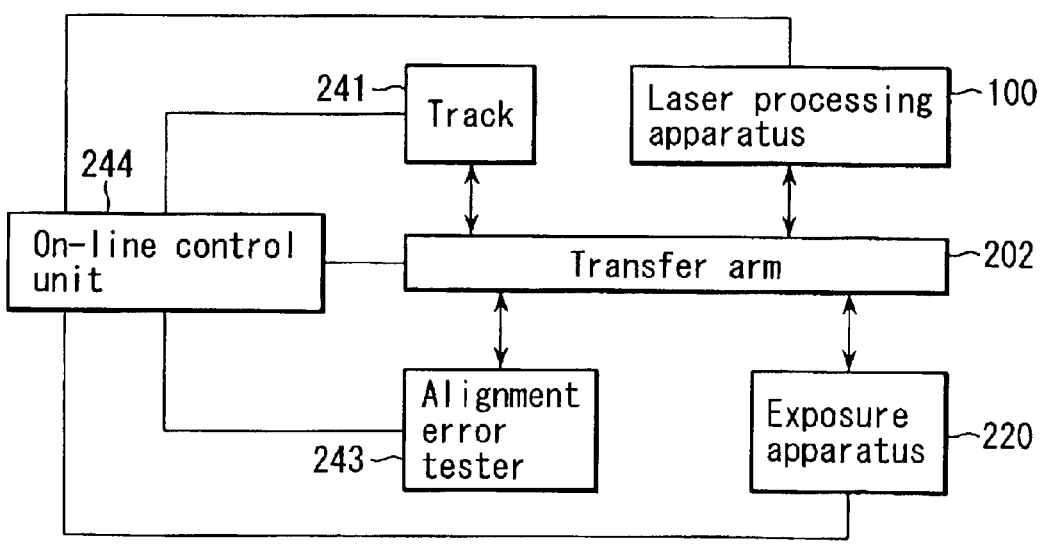
FIG. 10 is a block diagram showing a modification of the pattern forming system of FIG. 9.

The laser processing apparatus 100 may be disposed separately from the track 241 as shown in FIG. 10. In FIG. 10, like reference numerals are attached to the same components as FIG. 9 and a description thereof is omitted.

Next, an aperture and an aperture rotating mechanism employing an optical element according to an eighth embodiment of the present invention will be described schematically.

As the aperture and aperture rotating mechanism, it is permissible to employ an optical device (for example, digital micromirror device (Texas Instrument's trade mark)) in which fine mirrors whose direction can be changed are disposed two-dimensionally. The optical device can form an optical image having an arbitrary size and shape by controlling the direction of each fine mirror. Therefore, by controlling the direction of each fine mirror composing this optical device, laser beam of an optical image corresponding to the size and direction of the mark can be irradiated.

That is, the aperture rotating mechanism includes an optical device 150 having a plurality of fine mirrors, to which the laser beam 102a is incident, in a matrix shape and a control unit 152 for controlling the direction of each fine mirror disposed as shown in FIG. 11. The micro mirror 150 controls the direction of the fine mirror with electric signals or the like.

Desired beam shapes 161a, 161b, and 161c can be formed by controlling the direction of each fine mirror 151 in this micro mirror 150 as shown in FIGS. 12A to 12C.

Further, the beam shape can be rotated by controlling the direction of each fine mirror 151 by turning the beam shape synchronously with a rotation of a wafer, thereby providing a function as aperture and aperture rotation mechanism. In this micro mirror 150, formation of a desired beam shape is not restricted to rotation but the beam shape may be changed arbitrarily by expansion or contraction.

This optical device may be used as a scanning system for irradiating the laser beam to an arbitrary position on the substrate by controlling the direction of each fine mirror.

Next, as a ninth embodiment of the present invention, a pattern forming system in which the aforementioned laser processing apparatus is combined will be described.

Figure 13:
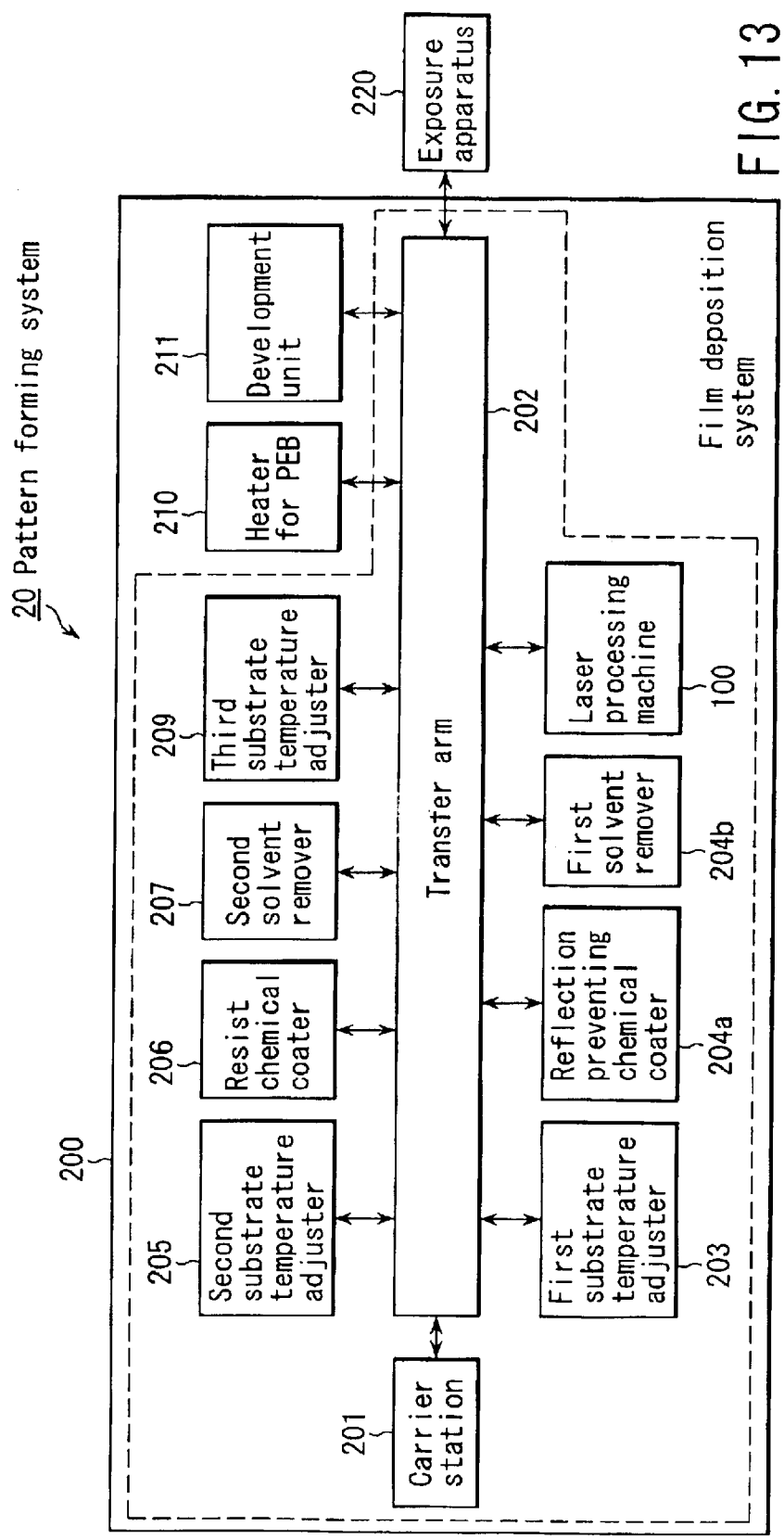
FIG. 13 is a block diagram schematically showing a pattern forming system according to a ninth embodiment of the present invention.

FIG. 13 is a block diagram showing an example of the pattern forming system. The pattern forming system 20 comprises a film deposition system 200 and an exposure apparatus 220. In the film forming system 200, the transfer arm 202 is connected to a carrier station 201 capable of disposing one or more substrates thereon. A first substrate temperature adjusting device 203, a reflection preventing chemical coating device 204a, a first solvent removing device 204b, a second substrate temperature adjusting device 205 of a first unit, a spin coating type resist chemical coating device 206, a second solvent removing device 207 of a second unit, a laser processing apparatus 100 of the first unit, a third substrate temperature adjusting device 209 of the first unit, a post exposure baking (PEB) step heating device 210 and a development unit 211 are connected to the transfer arm 202.

Although in a narrow meaning, a portion surrounded by dotted line is a film deposition system while the PEB step heating device 210 and the development unit 211 are included in the pattern forming system 200, the PEB step heating device 210 and the development unit 211 are included in the film forming system.

The exposure apparatus 220 is connected to the transfer arm 202 as a component separate from the film deposition system 200. The exposure apparatus 220 employs a projection type exposure apparatus which uses ArF excimer laser (193 nm) as an exposing light source and transfers a mask image onto a substrate through an exposure mask.

As a tenth embodiment of the present invention, a semiconductor device forming method using the aforementioned film forming system 200 and latent image forming system 220 will be described below.

Figure 14:
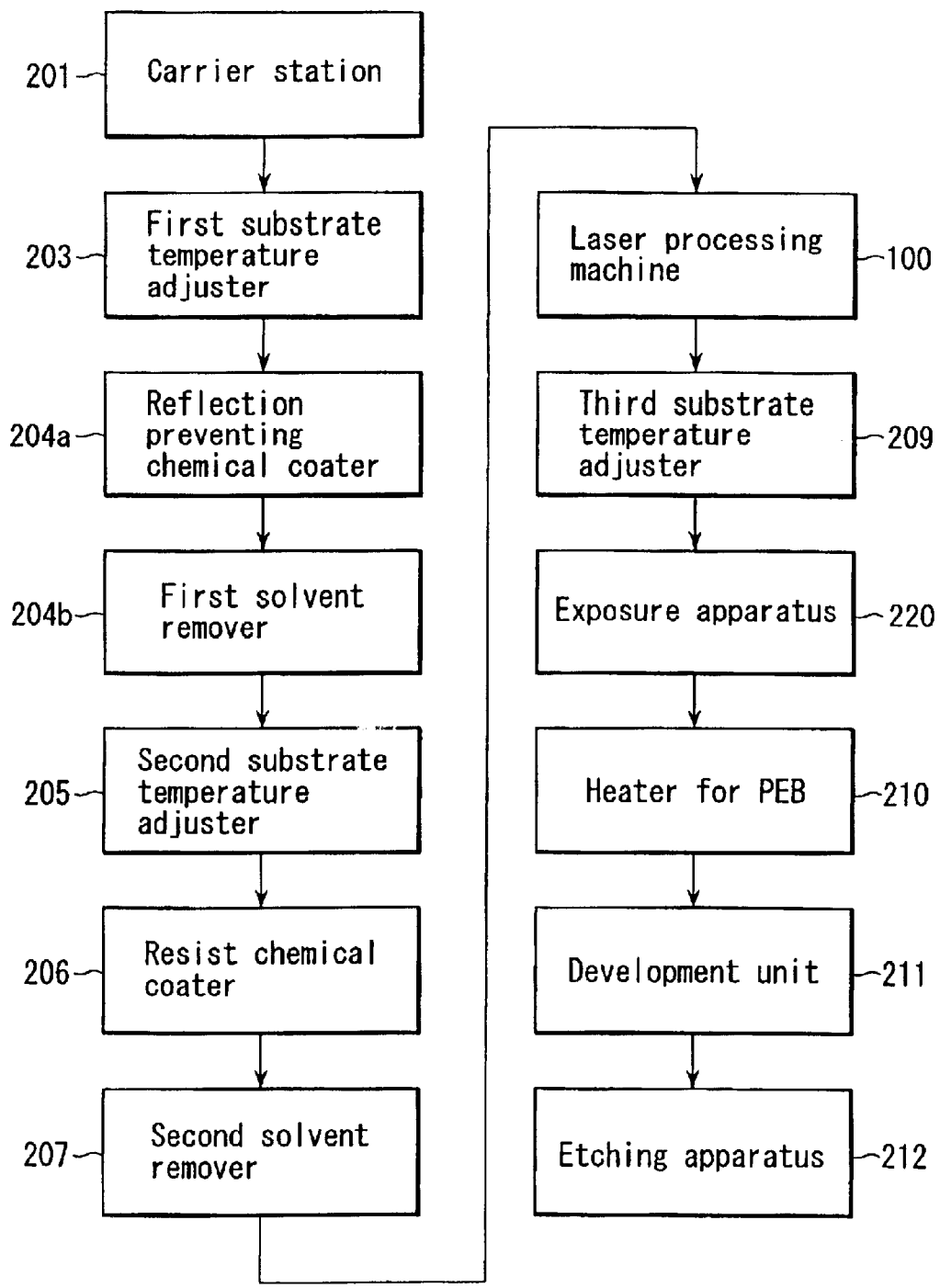
FIG. 14 is a diagram showing a flow of a substrate to be processed carried by a conveyor according to a tenth embodiment of the present invention.

FIG. 14 shows a flow of a semiconductor substrate to be carried by the transfer arm 202. FIGS. 15A to 15G show sectional views for explaining manufacturing process for a semiconductor device.

For this embodiment, a case where laser processing is carried out after a resist film is formed and water is used as a liquid for use upon irradiating with laser beam will be described.

Figure 15A:
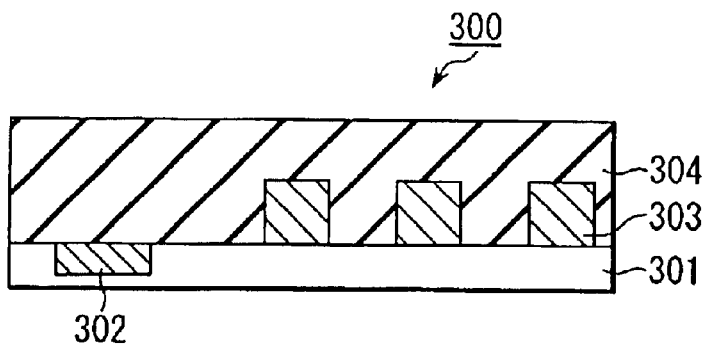
FIGS. 15A to 15J are diagrams for explaining a manufacturing process for a semiconductor device according to the tenth embodiment.

First, a carrier storing a semiconductor wafer 300 of 12 inch (300 mm in diameter), which is in a semiconductor device forming process, is placed in the carrier station 201. In the semiconductor wafer 300, as shown in FIG. 15A, 40 alignment marks 302 and 20 alignment error marks are buried in grooves formed in the semiconductor substrate 301. A pattern 303 such as wiring layers is formed on the semiconductor substrate 301 and an insulation film 304 whose surface is planarized is formed to cover the pattern 303. The semiconductor wafer 300 is carried to the first substrate temperature adjusting device 203 from the carrier station 201 by the transfer arm 202. The semiconductor wafer 300 is adjusted to a predetermined temperature by means of the first substrate temperature adjusting device 203. The semiconductor wafer 300 whose temperature is adjusted is carried to the reflection preventing chemical coating device 204a.

Figure 15B:
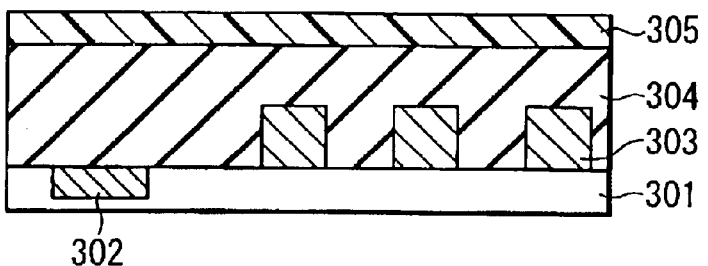
Figure 15C:
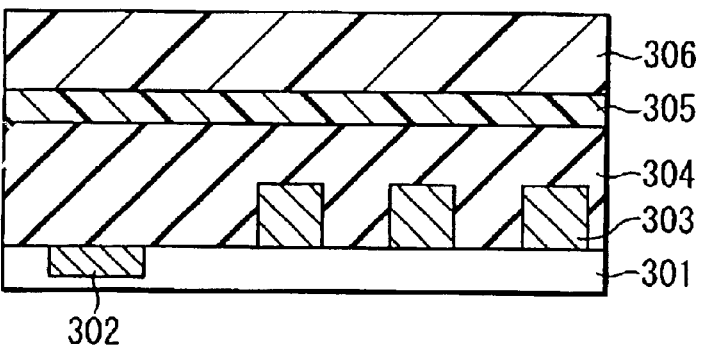

The reflection preventing chemical coating device 204a supplies a chemical containing reflection preventing film agent to the insulation film 304 on the main surface of the substrate and rotates so as to form a liquid film having a specified thickness containing reflection preventing agent on the main surface of the semiconductor substrate. The thickness of the liquid film at this time is 60 nm and the amount of solvent to its solids content is about 10%. Next, as shown in FIG. 15B, this semiconductor wafer 300 is carried to the first solvent removing device 204b and heated so as to remove solvent left in the liquid film, so that a reflection preventing film 305 of 56 nm in thickness is formed on the insulating film 304. Next, the aforementioned semiconductor wafer 300 is carried to the second substrate temperature adjusting device 205 so as to cool.

Next, the semiconductor wafer 300, which is cooled by the second substrate temperature adjusting device 205, is carried to the resist chemical coating unit 206. In the resist chemical coating device 206, the aforementioned semiconductor substrate is rotated and resist solvent composed of mainly ethyl lactate is dropped onto the reflection preventing film and spread by centrifugal force to form a uniform resist film of 500 nm in thickness. The semiconductor wafer 300 is then carried to the second solvent removing device 207 and heated to remove the solvent left in the resist film, so that the resist film 306 of 400 nm in thickness is formed.

Figure 15D:
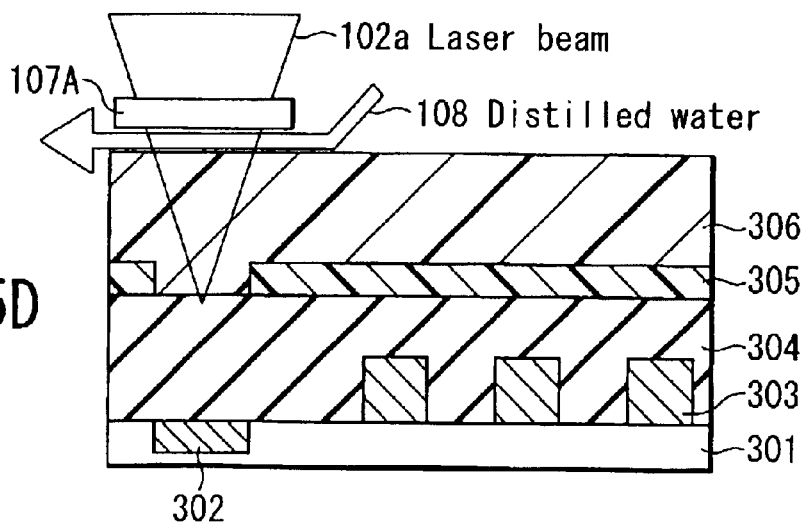
Figure 15E:
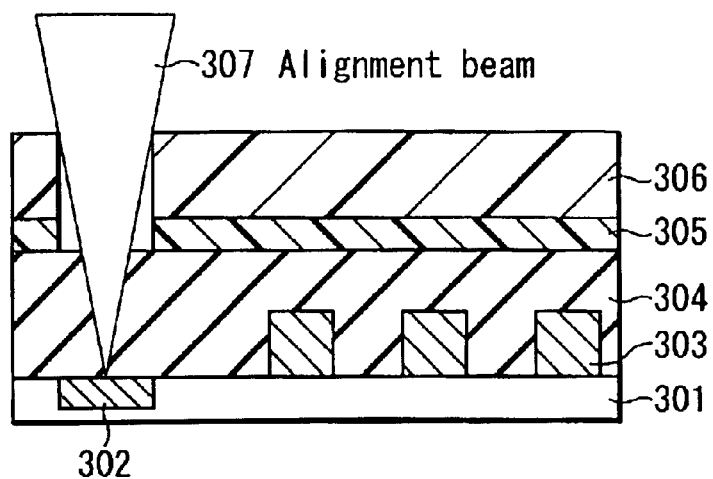

The semiconductor wafer 300 with the resist film 306 is carried to the laser processing apparatus 100 as shown in FIG. 15D. The semiconductor substrate is disposed on the stage 111 in the holder 107 of the laser processing apparatus 100. Distilled water is supplied to the main surface of the substrate with the semiconductor wafer 300 rotated slowly. At this time, ultrasonic wave is applied to the liquid 108 by the piezoelectric element 170.

The observation system 105 recognizes coordinate roughly by detecting a notch in the semiconductor wafer 300 and further recognizes the position of the alignment mark on the substrate by comparing an image on the observation camera (CCD camera) 105b installed on the top face of the substrate with an image template in which a preliminarily obtained alignment mark is registered, and then irradiates with the laser beam 102a based on this recognition information. Laser processing is carried out in an irradiation time of about 500 msec for each position so as to remove the resist film 306 on the alignment mark 302 and the accuracy measuring mark and the reflection preventing film 305 under the same resist film 306. Processing on all the marks can be finished in 50 seconds in an entire surface of the semiconductor wafer 300.

As a result of observation on the resist film after the laser processing, there is no defect such as void, transfer and swelling. Further, there is no scattered substance in the vicinity of a laser irradiation region.

This processing time is shorter than a processing time for each substrate in the latent image forming system and is a value set preliminarily based on processing time of the latent image forming system. Laser output and pulse count per pulse in the laser processing apparatus are automatically adjusted to secure this time.

By setting the processing time in the laser processing apparatus 100 shorter than the processing time in the latent image forming system, the substrate can be prepared for the latent image forming system before the processing in the latent image processing system is terminated, so that an entire throughput will not be changed.

After water 108 stored on the wafer 300 is discharged, the semiconductor wafer 300 is rotated rapidly to remove water on the surface roughly. After that, the semiconductor wafer 300 is carried to the second solvent removing device 207 and heated. The heating temperature for the semiconductor wafer 300 is 200° C. The reason why the semiconductor wafer 300 is heated is to remove water adhering to the surface of the resist film 306 to ensure the same exposure environment on an entire resist film surface. Unless this processing is carried out, acid produced by exposure is moved by a slight amount of water left in the film in a portion in contact with water so that a pattern failure occurs.

Next, this semiconductor wafer 300 is carried from the film forming system 200 to the exposure apparatus 220 using the transfer arm 202.

In the exposure apparatus 220, the alignment mark 302 on the semiconductor wafer 300 is detected by means of an alignment detector using the alignment beam 307 having the same wave length as the exposure wavelength. Because at this time, the reflection preventing film 305 on the alignment mark 302 is removed, an excellent detection strength is obtained. If the reflection preventing film 305 on the alignment mark 302 is not removed like conventionally, no alignment mark 302 can be detected.

Figure 15F:
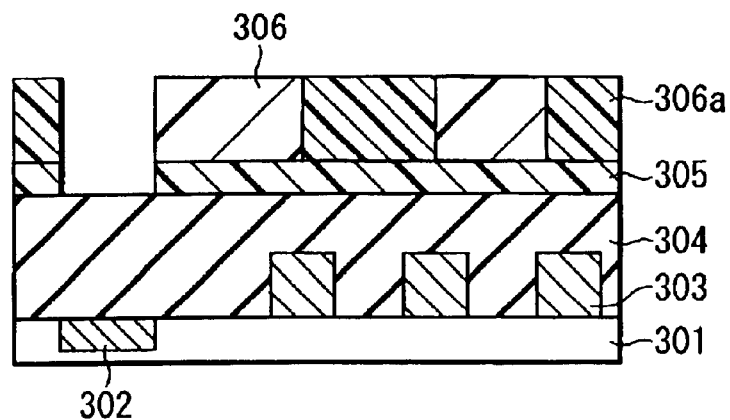

As shown in FIG. 15F, an exposing portion 306a of the resist film 306 is exposed based on alignment information about the alignment mark to form a latent image on the resist film 306. After the latent image is formed, the semiconductor wafer 300 is carried to the PEB step heating device 210 to execute heating (PEB) upon the semiconductor substrate. The heating is carried out to permit catalizer reaction of acid in the resist (chemical amplification type resist).

Figure 15G:
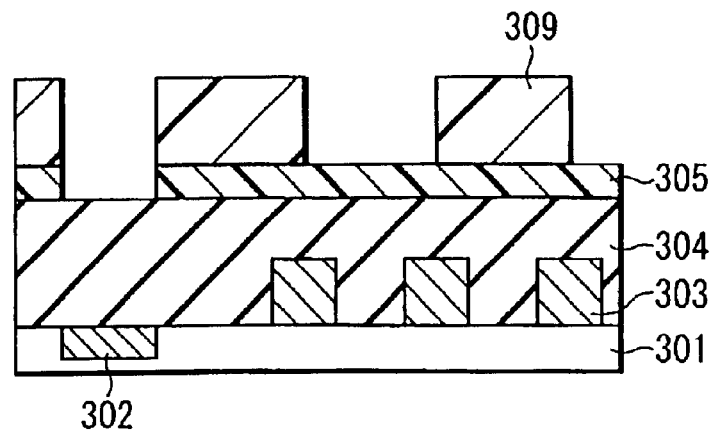

After this heating is carried out, as shown in FIG. 15G, the semiconductor wafer 300 is carried to the development unit 211 to develop the resist film 306, so that a resist pattern 309 is formed. Alignment accuracy of the formed resist pattern 309 is not more than ±5 nm.

Figure 15H:
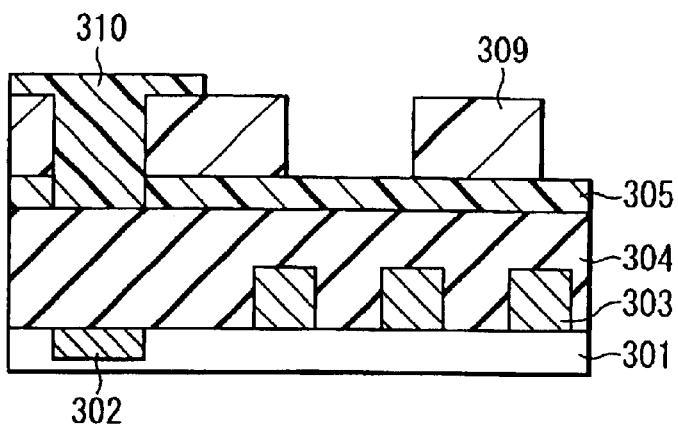
Figure 16:
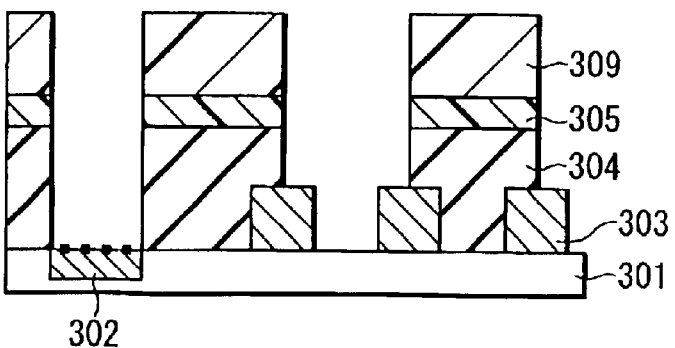
FIG. 16 is a diagram showing a state in which an insulating film is etched in the manufacturing process for the semiconductor device according to the tenth embodiment.

Next, the substrate is recovered from the pattern forming system and carried to the etching unit 212, in which the insulation film 304 is etched with the resist pattern 309 used as a mask. As shown in FIG. 16, a region from which the resist film 306 and the reflection preventing film 305 are removed by laser processing in order to observe the alignment mark 302 may be sometimes a problem in post process (for example, the mark is etched to deteriorate the shape on the surface). If such a problem occurs, the alignment film is covered with a protective film 310 of organic film as shown in FIG. 15H in a period from the termination of exposure up to before etching start. The protective film 310 is formed by coating material having a high selectivity on a resist film removing region selectively in a subsequent etching process. This selective coating is carried out by dropping a chemical from an exhaust nozzle (for example, injection needle).

Figure 15I:
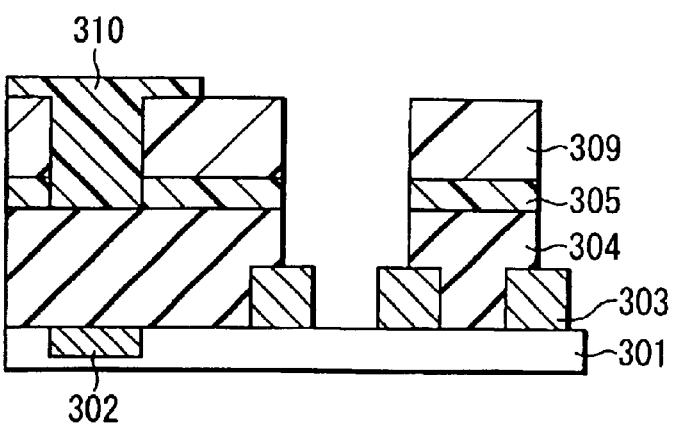
Figure 15J:
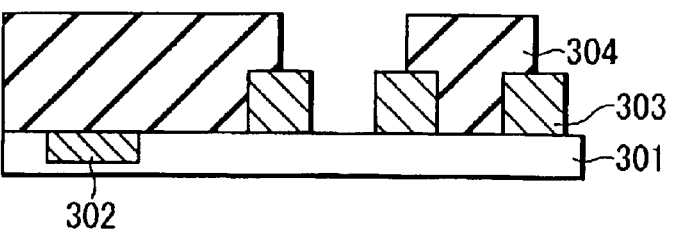

As shown in FIG. 15I, the reflection preventing film 305 and the insulation film 304 are etched successively to provide grooves therein. After that, the protective film 310, the resist pattern 309 and the reflection preventing film 305 are removed as shown in FIG. 15J.

As described above, this embodiment can restrict damage in the vicinity of the laser beam irradiation region by circulating the liquid in the laser beam irradiation region and can also reduce generation of scattered substance accompanied by energy beam irradiation. Further, it is possible to suppress a time needed for manufacturing of a product upon laser processing by providing the laser processing apparatus in the pattern forming system (film deposition system).

Further, a purpose of the invention can be achieved effectively by loading the laser processing apparatus in the pattern forming system (in this case, the laser processing means is a film deposition system) comprised of film formation, latent image formation and development (etching).

As for the operation and effect of this embodiment, if the laser processing means is provided in the exposure apparatus as disclosed in Jpn. Pat. Appln. KOKAI Publication No. 7-161623, it is difficult to supply a fluid to a processing point on a substrate or heat after the processing. On the other hand, if this laser processing means is installed independently, there is no way but carrying out the laser processing with a single batch processing as disclosed in Jpn. Pat. Appln. KOKAI Publication No. 7-161623, so that a time needed for manufacturing a product is increased enormously.

Although the ArF projection type exposure apparatus is employed in the latent image forming system in this embodiment, the present invention is not limited to this example. The latent image forming system can employ not only the ArF projection type exposure apparatus, but also apparatus having another exposing light source or every kind of latent image forming device such as X-ray exposure apparatus and extreme ultra-violet (EUV) exposure apparatus.

Although laser beam is irradiated to remove the resist film and reflection preventing film, even if energy beam such as ion beam and electronic beam is used other than laser beam, the resist film and reflection preventing film can be removed.

As the liquid for use upon laser processing of this embodiment, ultrasonic wave is applied to pure water. The reason why ultrasonic wave is employed is to facilitate removal of foreign matter from a substrate or the surface of film. Instead of using just distilled water, it is permissible to use oxidizing gas such as ozone and oxygen in order to remove foreign matter with oxidative destruction. Meanwhile if foreign matter can be removed easily, it is not necessary to use the ultrasonic wave applying means.

If foreign matter is likely to adhere to the surface of the resist film, it is recommendable to use hydrogen water in which hydrogen is dissolved upon laser processing. As other way to prepare environment in which foreign matter is likely to separate, it is permissible to use acid water in which hydrogen chloride is dissolved or alkaline water in which ammonia is dissolved.

As liquid for use upon laser processing, it is permissible to use organic solvent which does not damage the surface of resist. If the organic solvent is quick dry type and does not adhere to the surface of resist, heating process in post process may be canceled.

Further, according to the present invention, pieces of semiconductor wafers are carried mechanically from the film deposition system to the latent image forming system (exposure apparatus) and from the latent image forming system (exposure apparatus) to the development system. However, the present invention is not limited to this example, but if the exposure apparatus is placed separately from the film deposition system, it is permissible to carry manually between those or by batch of several pieces mechanically.

Although the configuration of the laser processing apparatus is not limited to the apparatus shown in the Figure, any structure is permissible as long as laser beam is projected while liquid flow is kept on the surface of a processing region of the semiconductor substrate.

Although according to the embodiment, the reflection preventing film and the resist film (coated film) are formed based on the rotation coating method, it is permissible to employ the linear coating method or the like in which the chemical is dropped from the chemical exhaust nozzle to the surface of a processing substrate while that nozzle is moved relatively to the substrate so as to form those films. In this case, because much solvent is contained in the liquid film, it is preferable to employ decompressing means instead of heating means so as to remove the solvent. In this case, it is recommendable to heat after the solvent is removed by exposing it under a decompressed environment near a saturation evaporation pressure. Further, it is permissible to heat after the laser processing by providing a heating device in the laser processing machine or providing a third solvent removing device in the film deposition system.

As an eleventh embodiment of the present invention, an example in which a solution obtained by dissolving ozone in distilled water is used as the liquid for use upon laser irradiation to remove the reflection preventing film will be described.

Because the configuration of the film deposition system 200 for use in the embodiment is the same as the ninth embodiment, only manufacturing process for the semiconductor device will be described.

FIGS. 17A to 17I show a manufacturing process for a semiconductor device according to the eleventh embodiment of the present invention.

Figure 17A:
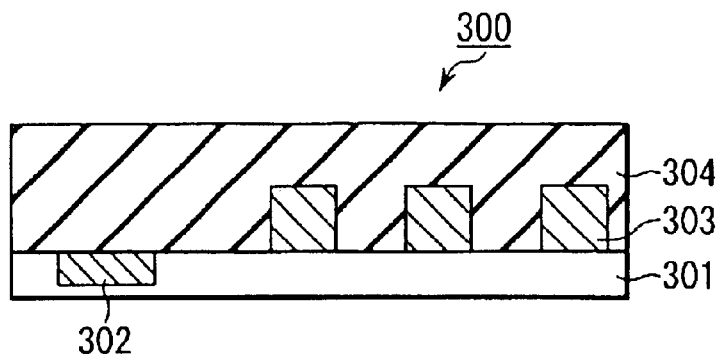
FIGS. 17A to 17I are diagrams for explaining a manufacturing process for a semiconductor device according to an eleventh embodiment of the present invention.

First, a 12-inch (300 mm in diameter) semiconductor wafer 300 in semiconductor device forming process is placed on the carrier station 201. As shown in FIG. 17A, the semiconductor wafer 300 contains 40 alignment marks 302 in grooves formed in the semiconductor substrate 301 and 20 alignment error marks (not shown). The pattern 303 such as wiring layers is formed on the semiconductor substrate 301 and the insulation film 304 whose surface is planarized is formed so as to cover the pattern 303 therewith. The semiconductor wafer 300 is taken out of the carrier station 201 by the transfer arm 202. The taken semiconductor wafer 300 is inserted into the first substrate temperature adjusting device 203 so as to adjust the substrate temperature to a predetermined temperature. The semiconductor wafer 300 whose temperature is adjusted is carried to the reflection preventing chemical coating device 204a.

The reflection preventing chemical coating device 204a supplies a chemical containing the reflection preventing film agent on the insulation film 304 of the main surface of the semiconductor wafer 300 and rotates it so as to form a liquid film having a predetermined thickness. The film thickness at this time is 60 nm and the quantity of solvent to solids content is about 10%.

Figure 17B:
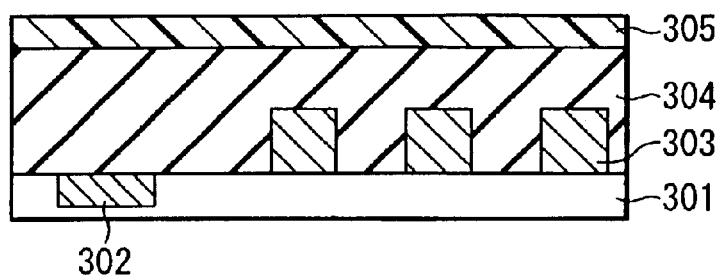

As shown in FIG. 17B, the semiconductor wafer 300 is carried to the first solvent removing device 204b so as to remove the solvent left in the liquid film, in order to form the reflection preventing film 305 of 56 nm in thickness. The semiconductor wafer 300 is then carried to the second substrate temperature adjusting device 205 and cooled.

The substrate whose main surface is coated with the reflection preventing film is carried to the laser processing apparatus shown in FIG. 1, for example.

Figure 17C:
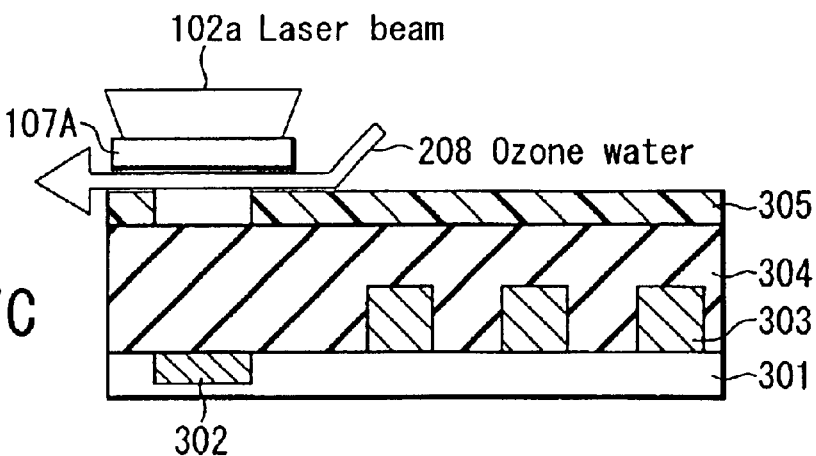

As shown in FIG. 17C, a solution (hereinafter referred to as ozone water) obtained by applying ultrasonic wave to ozone gas dissolved in distilled water while the substrate is rotated slowly is supplied to the main surface of the substrate. Although the ozone water ensures a very high transmissibility to the laser beam, the quartz glass plate 107a is provided parallel to the semiconductor substrate through a gap of 0.5 mm provided above the semiconductor substrate considering stability of laser processing (in terms of focusing position and processing position deflection) and the ozone water 108 is supplied to a space formed between the semiconductor substrate and the quartz plate. A notch in the semiconductor wafer 300 is detected to recognize a rough coordinate and by comparing an image in the observation camera 105b installed above the substrate with an image template in which an image in a region containing the preliminarily obtained positioning mark is registered, the mark on the substrate is recognized. Next, the reflection preventing film is processed by irradiating with laser beam based on recognition information about the alignment mark.

The laser beam is irradiated to a single position for about 500 msec so as to remove the reflection preventing film at 40 alignment mark portions and 20 alignment error marks for use in the latent image forming system. All the marks could be processed for 50 seconds. This time is shorter than a processing time for each piece in the latent image forming system and a value set up based on the processing time of the latent image forming device. This time is obtained as a result of automatic adjustment of laser output for a pulse and pulse count in the laser processing apparatus.

The ozone water 108 on the surface of the semiconductor wafer 300 is rotated rapidly and removed roughly, and then, the semiconductor wafer 300 is carried to the first solvent removing device 204b and heated. The heating temperature of the semiconductor wafer 300 is set to 200° C. The reason why heating is executed here is to remove the water adhered to the surface of the reflection preventing film 305 so as to ensure the same exposure environment. Unless this processing is carried out, acid generated by exposure in a portion in contact with water is moved by the water so as to generate pattern failure.

The heated semiconductor wafer 300 is carried to the second substrate temperature adjusting device 205 and cooled. Then, the cooled semiconductor wafer 300 is carried to the resist chemical coating device 206. The resist chemical coating device 206 rotates the semiconductor wafer 300 and drops the resist solvent composed of mainly ethyl lactate onto the reflection preventing film 305, so as to form a uniform resist film of 500 nm in thickness by spreading by centrifugal force.

Figure 17D:
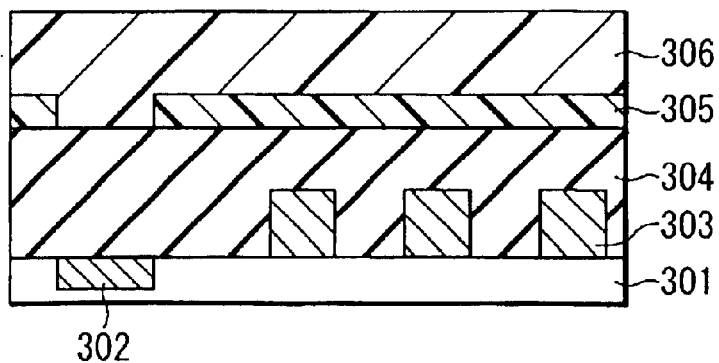

Thereafter, the semiconductor wafer 300 in which the resist film is formed on the surface thereof is carried to the solvent removing device 207 and heated. As shown in FIG. 17D, the solvent left in the resist film is removed so as to form the resist film 306 of 400 nm in thickness.

In-line transportation is carried using the transfer arm from the film deposition system to the latent image forming system.

Figure 17E:
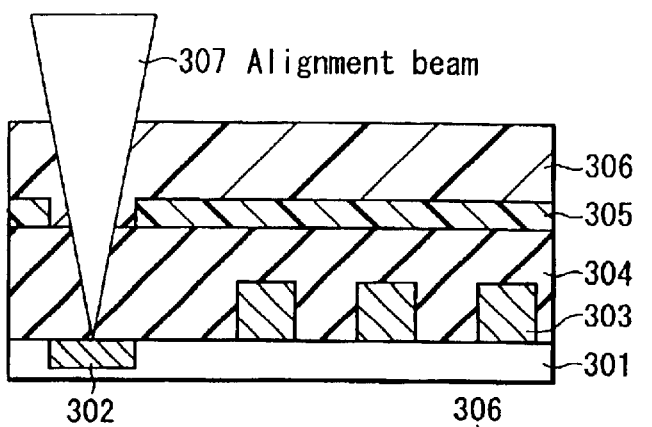

As shown in FIG. 17E, the exposure apparatus 220 detects the alignment mark on the semiconductor wafer 300 with the alignment detector which uses the same wavelength as exposure wavelength upon alignment light 307. At this time, an excellent detection strength was obtained.

Figure 17F:
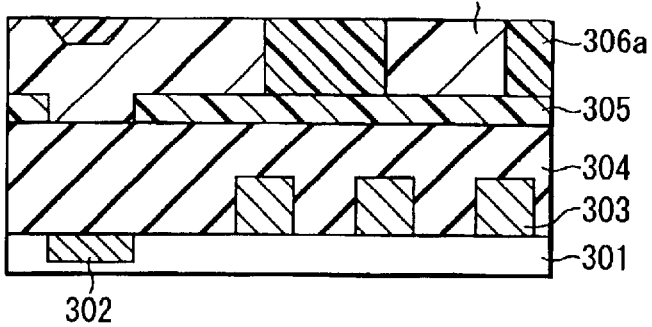

As shown in FIG. 17F, the resist film 306 is exposed based on alignment information obtained by measurement with the alignment detector to form the exposed portion 306a. When the reflection preventing film on the alignment mark was not removed like conventionally, no alignment mark could be detected (When the manufacturing was carried out forcibly, the alignment accuracy of the resist pattern formed by development was ±170 nm, so that the semiconductor device could be hardly manufactured).

After the latent image is formed, this is carried to the PEB step heating device 210 of the film deposition system 200, in which heating processing on the semiconductor wafer 300 is carried out. The reason why the heating processing (PEB) is carried out is to urge catalytic reaction of acid in the used resist (chemical amplification type resist).

Figure 17G:
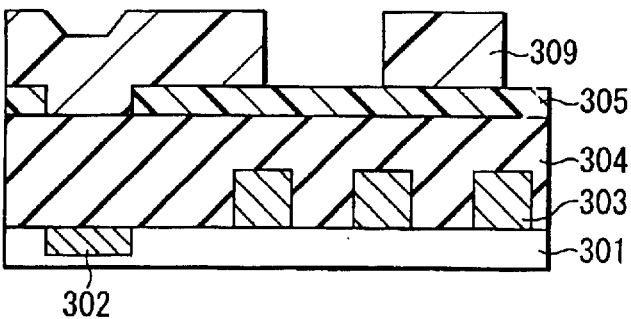
Figure 17H:
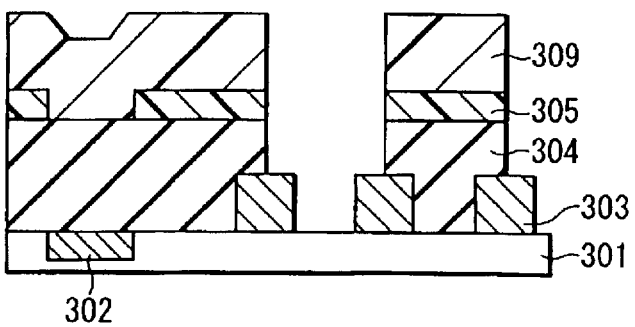
Figure 17I:
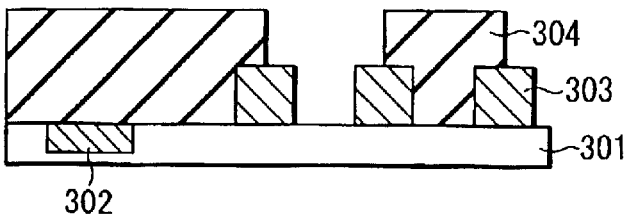

After the heating processing, as shown in FIG. 17G, the semiconductor substrate is carried to the development unit 211, in which the resist film 306 is developed to form a desired resist pattern 309 having an alignment accuracy of not more than ±5 nm. Further as shown in FIG. 17H, with the resist pattern 309 as a mask, the reflection preventing film 305 and the insulation film 304 on the underlying layer are etched and as shown in FIG. 17I, the resist pattern 309 and the reflection preventing film 305 are removed.

As described above, the embodiment enables to suppress damage in the vicinity of a laser beam irradiation region by circulating the liquid to the laser beam irradiation region and to reduce generation of scatter substance accompanied by the energy beam irradiation.

Further, by providing the laser processing apparatus in the pattern forming system (film deposition system), time needed for manufacturing of a product upon laser processing can be suppressed.

Upon the laser processing, the solution obtained by applying ultrasonic wave to distilled water in which ozone is dissolved is employed. The reason why the distilled water in which ozone is dissolved is used is to decompose foreign matter on the reflection preventing film by oxidation with ozone. For the same purpose, it is permissible to use the solution obtained by dissolving oxidation gas such as oxygen in the distilled water.

Further, if foreign matter is likely to adhere to the surface of the reflection preventing film, it is recommendable to use hydrogen water produced by dissolving hydrogen in the distilled water upon laser processing. Additionally, in order to secure an environment which permits easy separation of foreign matter, it is also permissible to use acid water produced by dissolving hydrogen chloride in the distilled water or alkaline water produced by dissolving ammonia in the distilled water. Further, the reason why ultrasonic wave is employed is to make foreign matter to leave the surface of the substrate or film easily.

Although the embodiment employs the ArF projection type exposure apparatus as a latent image forming device, the present invention is not limited to this example. As the latent image forming device, it is permissible to use not only the ArF projection type exposure apparatus, but also devices having other exposing light source or every kind of latent image forming device such as an electronic beam exposure apparatus, an X-ray exposure apparatus and an EUV exposure apparatus.

According to the invention, all pieces of the semiconductor substrates are carried mechanically from the film deposition system to the latent image forming system (exposure apparatus) and from the latent image forming system (exposure apparatus) to the development system. However, the present invention is not limited to the example, but if the exposure apparatus is placed separately from the film deposition system, it is permissible to carry manually between those or by batch of several pieces mechanically.

Figure 18:
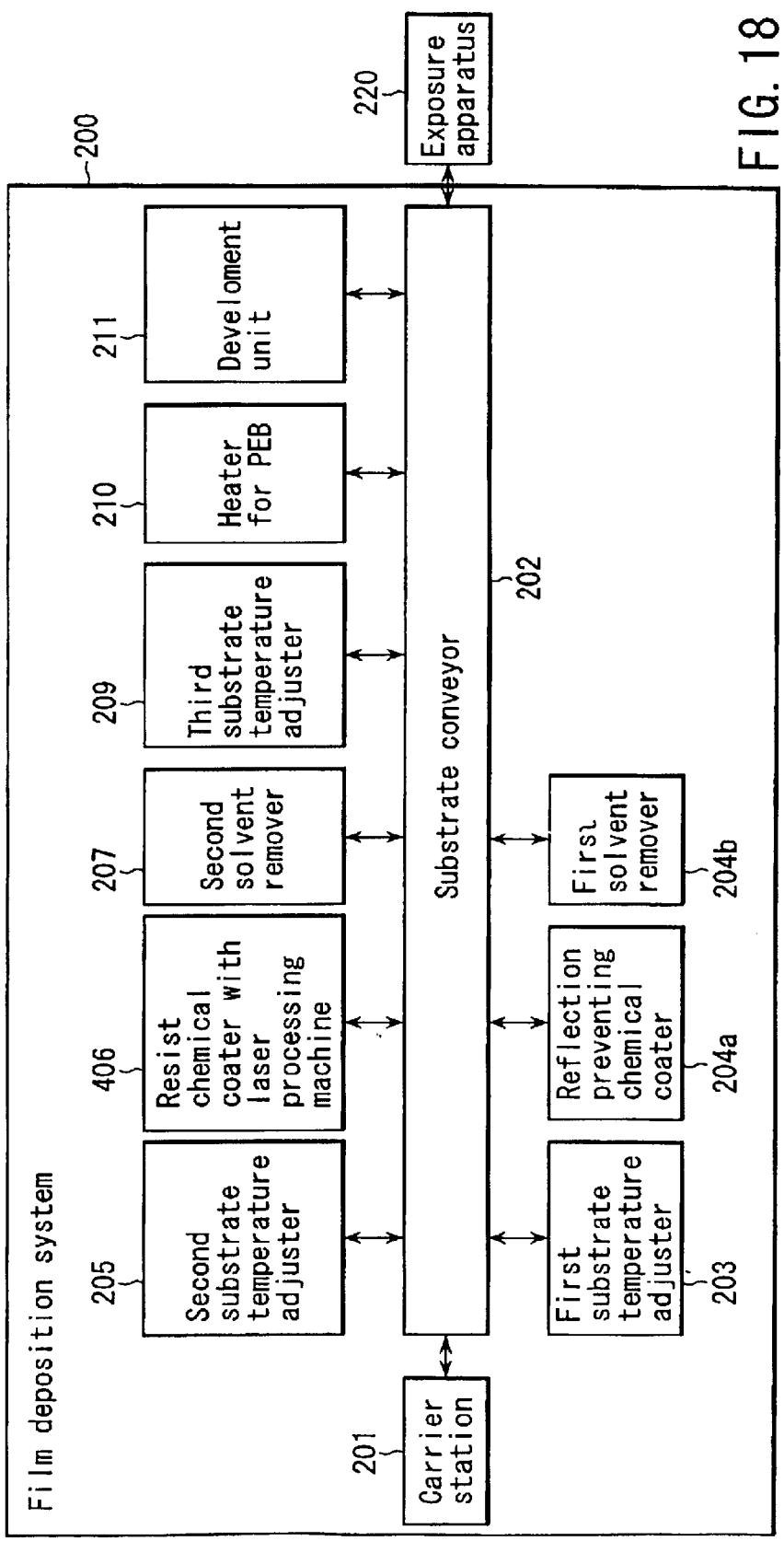
FIG. 18 is a block diagram schematically showing a pattern forming system according to a twelfth embodiment of the present invention.

FIG. 18 is a block diagram showing a pattern forming system employing a film deposition system 200 comprised of a coating thin film forming device and a laser processing apparatus according to a twelfth embodiment of the present invention. In FIG. 18, like reference numerals are attached to the same components as FIG. 13 and a description thereof is omitted.

The feature of this film deposition system is that the resist chemical coating device and the laser processing apparatus, which are separate components in the ninth embodiment, are combined to a unit of laser processing apparatus provided resist chemical coating device 406. Meanwhile, the apparatus 406 is of rotation coating type.

According to the embodiment, as a latent image forming system, a projection type exposure apparatus, which employs KrF excimer laser (248 nm) as its exposing light source to apply a mask image to the substrate through an exposure mask, is used.

Semiconductor device manufacturing process with the system shown in FIG. 18 will be described. Because the manufacturing process of the embodiment is the same as the tenth embodiment, a detailed description thereof is omitted and only process relating to laser processing and resist film coating will be described.

After the reflection preventing film is formed on the substrate, that substrate is carried to the resist chemical coating device provided with the laser processing machine. First, a process for removing the reflection preventing film at 40 alignment mark portions for use in the latent image forming means and 20 alignment error marks in the substrate.

The resist chemical coating device with the laser processing machine includes components shown in FIG. 1 and additionally has such a structure that allows the resist chemical supply nozzle 183 to be moved between the substrate 110 and the partition plate 184 so as to supply resist chemical onto the main surface of the substrate.

First, the substrate is disposed on the stage 111. A nozzle for supplying ethyl lactate (one of solvents contained in the resist solution) having solubility to the solvent used as the resist solution onto the substrate is disposed above the substrate and with the substrate rotated slowly, the chemical is supplied. A quartz plate is disposed with a gap of 0.2 mm relative to the substrate surface for the ethyl lactate to have a thickness having transparency to laser wavelength of 256 nm and then the ethyl lactate is supplied to that gap. A notch in the semiconductor substrate is detected to recognize a rough coordinate and by comparing an image in the observation camera 105b installed above the substrate with an image template in which an image in a region containing the preliminarily obtained alignment mark is registered, the mark on the substrate is recognized. Next, the laser processing is carried out based on the recognized information. The laser processing is carried out to a single location for about 300 msec and all the marks in the entire substrate are processed. This time is shorter than a processing time for a single piece in the latent image forming device and a value set based on processing time of the latent image forming apparatus. This time is obtained as a result of automatic adjustment of laser output for a pulse and pulse count in the laser processing apparatus.

After laser processing, both supply of a solvent and rotation of the substrate are accomplished so that a solvent of ethyl lactate is supplied to an entire surface of the substrate. Because there is a difference in wettability between a portion supplied with ethyl lactate and a portion not supplied therewith, the entire surface of the substrate is exposed to ethyl lactate. Thereafter, by throwing away the ehyl lactate from the surface of the substrate, most of ethyl lactate is removed therefrom.

This processing should be executed since the solvent used in laser processing has a characteristic of being apt to leave on the substrate and this affects resist coating characteristic in next resist coating process. If the solvent used in the laser processing is of quick dry type and does not affect the surface of the substrate, the aforementioned processing does not have to be carried out.

Ethyl lactate is contained in the resist solution to be applied subsequently and needless to say, is soluble with the resist solution. Although according to the embodiment, as the solution soluble in the resist solution, ethyl lactate contained therein is employed, the present invention is not limited to the example, but any solvent may be used as long as it is soluble with the resist solvent.

A resist solvent supply unit (not shown in FIG. 1) is disposed above the main surface of the substrate and the resist solvent composed of mainly ethyl lactate is dropped. Then, by spreading this ethyl lactate by centrifugal force, uniform resist film of 500 nm in thickness is formed. Next, this substrate is carried to the second solvent removing device 207 and heated so as to remove solvent left in the resist film, thereby forming the resist film of 400 nm in thickness.

Because the latent image formation, exposure and etching processes followed by this process are the same as the tenth embodiment, description thereof is omitted.

Although the embodiment employs the KrF projection type exposure apparatus as the latent image forming device, the present invention is not limited to the example. As the latent image forming device, it is permissible to use not only the KrF projection type exposure apparatus but also every kind of latent image forming device such as an electronic beam exposure apparatus, an X-ray exposure apparatus and an EUV exposure apparatus.

Further, although the laser processing means is included in the film forming means in the embodiment, if the liquid for use in the laser processing is distilled water, its supply system may be partly combined with the development means or etching means.

The resist chemical coating device 406 with the laser processing machine is not limited to the machine shown in FIG. 1, any structure may be applied as long as it generates a circulation of liquid on the surface of the processing region of the substrate upon the laser processing.

Although according to the embodiment, liquid film is produced based on the rotation coating method, it is permissible to employ linear coating method or the like. In this case, because the quantity of solvent in liquid film is very large, it is preferable to use a decompressing means instead of a heating means in order to remove the solvent. In this case, it is recommendable to remove the solvent from the substrate left near a saturated evaporation pressure and heat it.

Further, the reflection preventing film does not have to be of organic film unlike the embodiment. For example, this may be of inorganic film such as $SiN_xO_y$ (x, y are composition ratios) and carbon formed based on sputtering method, CVD method or the like.

When light sensitive polyimide on the most upper layer is patterned in lithography process for the semiconductor manufacturing apparatus, there occurs such a problem that the alignment mark is difficult to observe even if ordinary visible light is used, because the polyimide film absorbs light or damps it. Of course, if light having the same wavelength as exposure light is used as alignment mark observing light, the mark cannot be detected.

In a next embodiment, a pattern forming apparatus which carries out coating/formation of the light sensitive polyimide film and patterning will be described.

Figure 19:
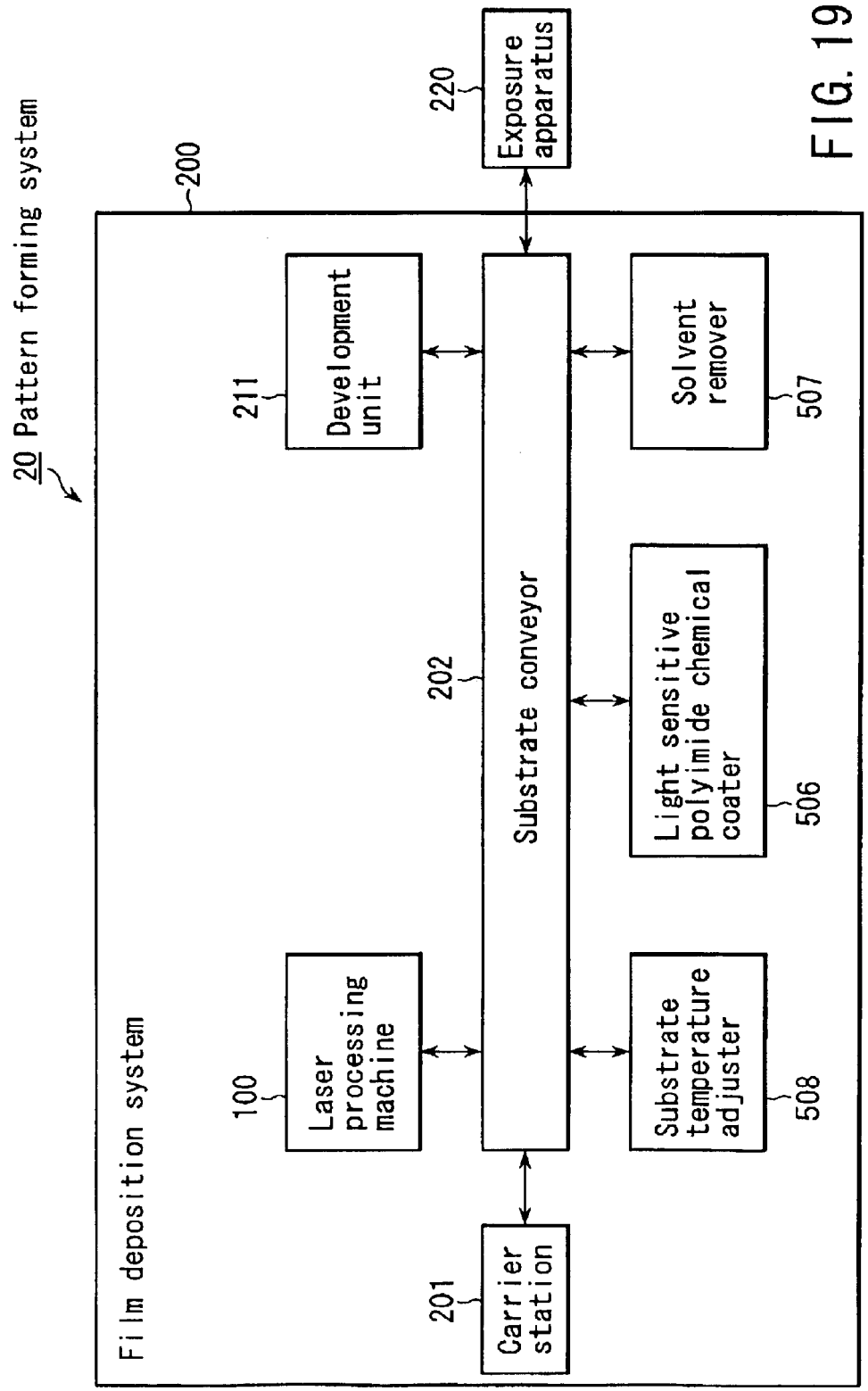
FIG. 19 is a block diagram schematically showing a pattern forming system according to a thirteenth embodiment of the present invention.

FIG. 19 is a block diagram showing a pattern forming system according to a thirteenth embodiment of the present invention. In FIG. 19, like reference numerals are attached to the same components as FIG. 13 and a detailed description thereof is omitted.

As shown in FIG. 19, the system comprises a light sensitive polyimide coating device 506 and a solvent removing device 507. It further includes the laser processing apparatus 100 for removing the light sensitive polyimide film on a region including the alignment mark after the light sensitive polyimide film is formed.

Next, a process for forming and patterning of the light sensitive polyimide using the system will be described with reference to FIGS. 20A to 20D.

First, a semiconductor substrate, which includes an alignment mark 603 and a pad 604 in an interlayer insulation film 602 formed on a Si substrate 601, is prepared, and is disposed on the carrier station 201. The interlayer insulation film represents a silicon oxide film, a low dielectric constant film composed of mainly silicon oxide film containing methyl base, a low dielectric constant film composed of organic material, or an insulation film such as silicon nitride film formed on a semiconductor substrate.

Figure 20A:
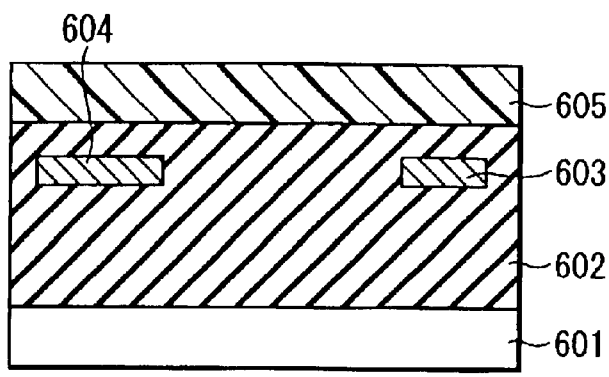
FIGS. 20A to 20D are diagrams for explaining a manufacturing process for a semiconductor device according to the thirteenth embodiment.

The semiconductor substrate in the carrier station 201 is carried to the light sensitive polyimide chemical coating device 506 using the transfer arm 202. The light sensitive polyimide chemical coating device 506 provides light sensitive polyimide liquid film on the interlayer insulation film 602 formed on the main surface of the semiconductor substrate. Next, the semiconductor substrate is carried from the light sensitive polyimide chemical liquid coating device 506 to the solvent removing device 507 using the transfer arm 202. The solvent removing device 507 evaporates solvent in liquid film by heating the semiconductor substrate so as to form the light sensitive polyimide film 605 as shown in FIG. 20A. The semiconductor substrate is then carried from the solvent removing device 507 to the substrate temperature adjusting device 508 using the transfer arm 202 and cooled.

Figure 20B:
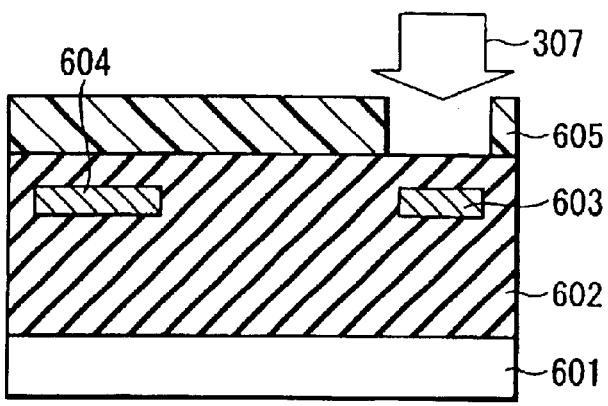

The semiconductor substrate is carried from the substrate temperature adjusting device 508 to the laser processing apparatus 100 using the transfer arm 202. In the same process as the eleventh embodiment, the laser beam is applied to the light sensitive polyimide film with distilled water supplied to the surface of the semiconductor substrate, thereby removing the light sensitive polyimide film 605 provided on a region containing the alignment mark 603 as shown in FIG. 20B.

The laser oscillator used for the laser processing is capable of selecting any one of the fourth harmonics, the third harmonics and the second harmonics in the Q-switch YAG. The wavelength of each harmonic is 266 nm, 355 nm and 532 nm, respectively. The wavelength can be selected appropriately so as to ensure an optimum processing condition depending upon material formed under the polyimide film and thickness thereof.

In the embodiment, the wavelength of 355 mm is used because the interlayer insulation film 602 formed under the polyimide film 605 is not processed. In the case where silicon nitride film is formed on the most upper layer of the interlayer insulation film, it is recommendable to use the wavelength of 266 nm so as to remove not only for example polyimide but also that silicon nitride film.

The thickness of the light sensitive polyimide film 605 is 3 μm and the laser irradiation energy density is 0.5 J/cm². Processing rate at the energy irradiation of 0.5 J/cm² is 0.3 μm/pulse. However, the processing rate is changed about ±20% because of influences such as local variation of polyimide film thickness or unevenness in the laser energy plane.

Therefore, this apparatus automatically observes to see whether or not the polyimide is removed using the observation system 105 upon processing and adjusts pulse count and pulse energy appropriately depending on an irradiation position.

When removing polyimide of 3 μm in thickness with irradiation energy of 0.5 J/cm², the polyimide on the mark can be removed with such pulse count as 10 pulses to 15 pulses. A laser processing apparatus having no observation system 205 can remove from all regions by the laser irradiation of 15 pulses.

However, because the pulse count and energy can be automatically controlled by providing with the observation system 105 and mechanism for checking processing shape, unwanted irradiation can be eliminated, thereby improving processing time remarkably.

Upon the laser processing, electric power of 40 kHz, 50 W was applied to the piezoelectric element 270 at least during the laser beam irradiation. As shown in FIG. 20B, no scattering of processing residue was observed within and around the laser processing region. Further, no damage such as peeling and crack was observed.

Removing the light sensitive polyimide film 605 on a region containing the alignment mark 603 by laser processing facilitates observation of the mark using an alignment scope based on visible light so as to reduce the alignment error remarkably, thereby increasing the yield. Further, although such mark cannot be observed if the polyimide is formed when using exposure light as alignment light, the alignment mark can be observed by removing the polyimide film.

The semiconductor substrate is then carried from the laser processing apparatus 100 to the solvent removing device 507 using the transfer arm 202. Thereafter, the solvent removing device 507 dries the surface of the semiconductor substrate by heating. The semiconductor substrate is carried from the light sensitive polyimide film forming machine to the temperature adjusting device 508 using the transfer arm 202 and cooled. Although in the embodiment, distilled water is utilized as cooling refrigerant for the laser processing, no drying process is necessary in the case of using thinner as the solvent.

Figure 20C:
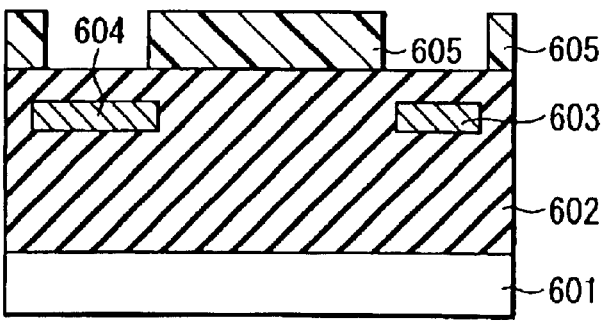

Next, the semiconductor substrate is carried from the temperature adjusting device 508 to the exposure apparatus 220 using the transfer arm 202. In the exposure apparatus 220, the alignment mark is detected by means of the alignment detector using the same wavelength as the exposure wavelength as the alignment light 307. The light sensitive polyimide film 605 is exposed based on the alignment information obtained by the measurement with the alignment detector. The semiconductor substrate is carried from the exposure apparatus 220 to the development unit 211 using the transfer arm 202, and as shown in FIG. 20C, the exposed light sensitive polyimide film 605 is developed to form a light sensitive polyimide film pattern.

Figure 20D:
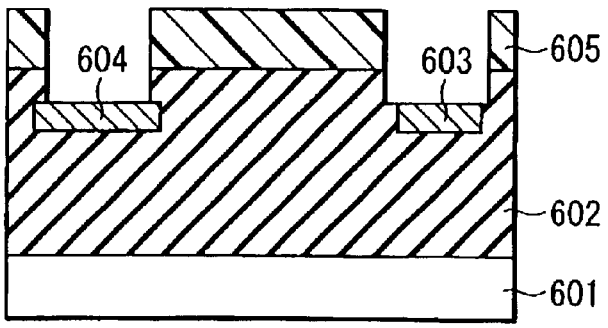

Thereafter, the semiconductor substrate is carried to the etching apparatus (RIE device) 212 and as shown in FIG. 20D, with the light sensitive polyimide film pattern as a mask, the interlayer insulation film 602 is etched to expose the pad 604.

As described above, the laser processing on the light sensitive polyimide film in the cooling solution such as the distilled water eliminates scattering of the cooling solution, so that decrease of the yield due to read error or bad influence upon patterning, which is a problem in processing in the atmosphere, will be eliminated.

As a laser processing apparatus for facilitating observation of the mark by removing the polyimide on the mark by laser irradiation, Jpn. Pat. Appln. KOKAI Publication No. 10-113779 has disclosed an apparatus for removing the polyimide by irradiating with laser in the atmosphere. However, in this proposed apparatus, processing residue is scattered in and around a removal region because the laser is irradiated in the atmosphere, so that the mark read error is increased and the patterning in the surrounding will be affected badly, thereby decreasing the yield.

In the thirteenth embodiment, a process for removing polyimide on the mark has been described. In a fourteenth embodiment of the present invention, a method of making a pad opening or patterning for forming a fuse window in the polyimide film by using laser processing will be described. The fuse represents a fuse connected to a redundancy circuit and trimming circuit.

Figure 21:
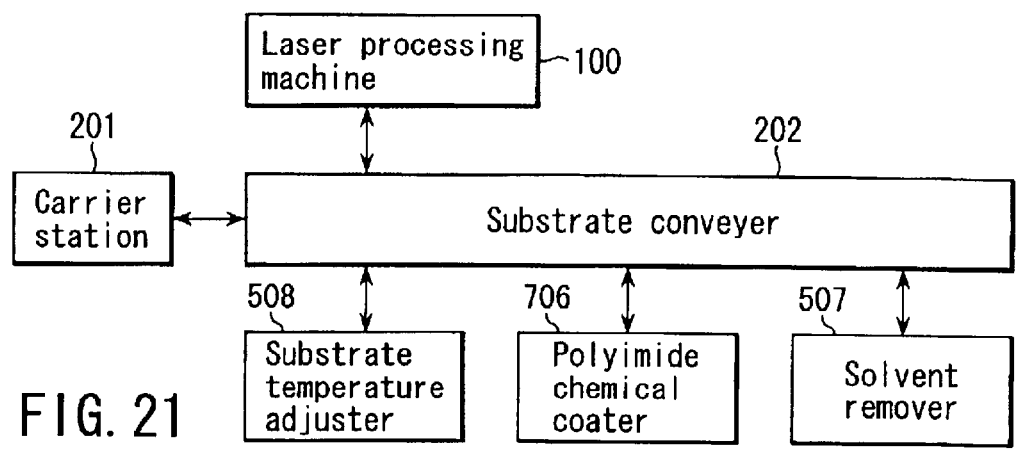
FIG. 21 is a diagram schematically showing a film forming system according to a fourteenth embodiment of the present invention.

FIG. 21 is a block diagram schematically showing a film deposition system of the fourteenth embodiment of the present invention. In the same Figure, like reference numerals are attached to the same components as FIG. 19 and a detailed description thereof is omitted.

Because no resist film pattern is formed, the film deposition system shown in FIG. 21 has no latent image forming system or development system, different from the pattern forming system shown in FIG. 19. As a chemical coating device, a polyimide chemical coating device 706 is provided.

Manufacturing process for a semiconductor substrate according to the fourteenth embodiment of the present invention will be described with reference to sectional views of FIGS. 22A to 22C.

Figure 22A:
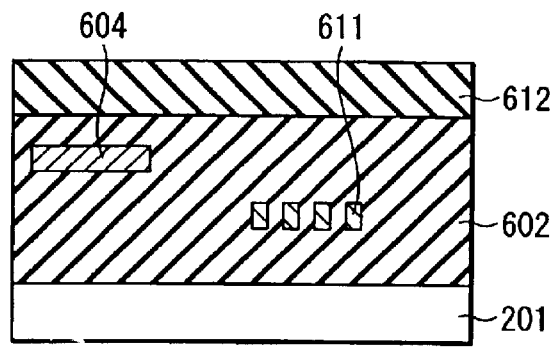
FIGS. 22A to 22C are diagrams for explaining a manufacturing process for a semiconductor device according to the fourteenth embodiment.

A semiconductor substrate is prepared which includes the pad 604 and fuses 611 in the interlayer insulation film 602 provided on the Si substrate 601 thereof as shown in FIG. 22A. This semiconductor substrate is then carried to the polyimide chemical coating device 706 to coat it with a polyimide chemical. After the semiconductor substrate is carried to the solvent removing device to remove the solvent in the coating film, a polyimide film 612 is formed on the interlayer insulation film 602. At this time, as the polyimide film 612, it is not necessary to use a light sensitive polyimide film like used in the thirteenth embodiment. Therefore, a very cheap polyimide may be used.

Next, the same semiconductor substrate is carried to the laser processing apparatus shown in FIG. 2 to execute the laser processing. The laser beam used for laser processing is third harmonics of the Q-switch YAG with the wavelength of 355 nm.

The thickness of the polyimide film is 3 $\mu$m and the density of laser irradiation energy is 0.5 J/cm$^2$ per pulse. This apparatus processes by automatically observing to see whether or not the polyimide is removed using the observation system shown in FIG. 2 and controls the pulse count and pulse energy appropriately depending upon an irradiation place.

Figure 22B:
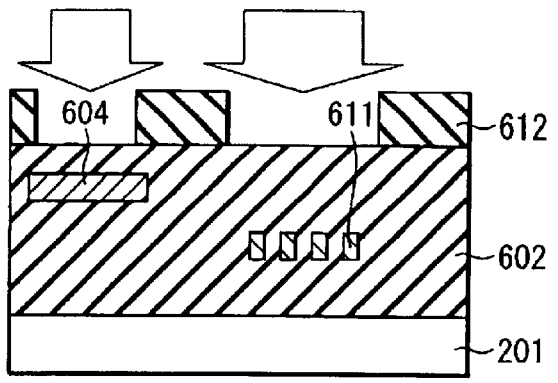
Figure 22C:
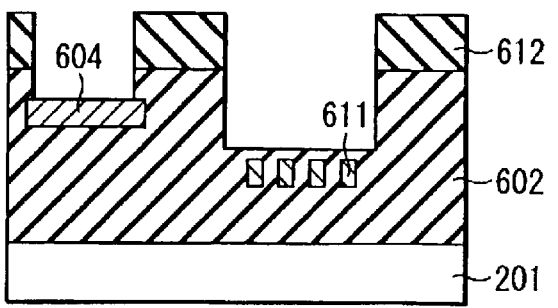

FIG. 22B shows the configuration after the polyimide film on the pad 604 and the fuse 611 is removed using the apparatus shown in FIG. 2. Upon the processing, electric power of 40 kHz, 50 W was applied to the piezoelectric element at least during laser irradiation.

Although alignment procedure was carried out by observing an alignment mark using visible light at this time, if alignment observation is difficult or alignment error occurs, removing the polyimide on the alignment mark as mentioned in the previous embodiment facilitates observation of the alignment mark. As shown in FIG. 22B, no scattering of processing residue was observed in and around a laser processing region. Further, no damage such as peeling and crack was observed.

The substrate is then carried to the RIE apparatus, and with the polyimide film 612 as a mask, the interlayer insulation film 602 is etched to expose the pad 604 and form a fuse window.

The laser processing can be executed by applying the laser beam in the liquid to suppress unwanted production of processing residue of polyimide on the mark, pad and fuses and irradiation damage. According to the method, not only the yield of the semiconductor substrate is improved, but also bad influence upon the environment can be reduced because the development process, chemical process and the like in the lithography process can be reduced.

Meanwhile, the present invention is not limited to the above-described embodiments, but may be modified in various ways in a scope not departing from its gist.

According to the present invention, as described above, by applying the laser beam substantially at right angle to the substrate, irradiation of the laser beam to other regions than a removal region is prevented, thereby making it possible to remove the polyimide film from only the removal region.

Further, by applying the laser beam in the liquid, it is possible to execute the laser processing while suppressing generation of processing residue on the mark, pad and fuse and irradiation damage.

What is claimed is:

1. A method of manufacturing a semiconductor device comprising:

forming a first thin film on a main surface of a semiconductor substrate having an alignment mark;

applying a first energy beam to said first thin film provided on a region containing said alignment mark to selectively remove part of said first thin film;

supplying a chemical containing both a light sensitive material and a solvent onto said first thin film to provide a coating film thereon;

removing said solvent contained in said coating film to form a light sensitive thin film;

carrying said semiconductor substrate to latent image forming means and irradiating said positioning mark with a reference beam through a region in which said first thin film is selectively removed, thereby to recognize a position of said alignment mark;

irradiating a predetermined position on said light sensitive thin film with a second energy beam based on the position of the recognized alignment mark to form a latent image on the light sensitive thin film; and forming a light sensitive thin film pattern by removing at least part of said light sensitive thin film based on the latent image formed on said light sensitive thin film, wherein upon irradiating the first energy beam, liquid is supplied to at least a region irradiated with first energy beam.

2. The method according to claim 1, wherein any one selected from distilled water and organic solvent having transparency to the first energy beam is used as said liquid.

3. The method according to claim 1, wherein, any one selected from oxidizing water, reduced water, alkaline water and acid water, in which at least one of ozone, oxygen, hydrogen, ammonia, carbon dioxide and hydrogen chloride is dissolved, is used as said liquid.

4. The method according to claim 1, wherein ultrasonic wave is applied to said liquid.

5. The method according to claim 1, wherein after part of said first thin film is removed, said semiconductor substrate is heated to remove liquid left on said main surface.

6. The method according to claim 1, wherein said first thin film reduces the intensity of reflection light of said second energy beam reflected by a lower layer of said light sensitive thin film.

7. The method according to claim 1, wherein as light source of said reference light, the same light source as said second energy beam is used.

8. The method according to claim 1, wherein the step of selectively removing part of said light sensitive thin film and the step of forming said light sensitive thin film are executed continuously in the same apparatus and as said liquid, solution soluble with said chemical is employed.

9. The method according to claim 1 further including heating said semiconductor substrate to remove said liquid left on said main surface provided between selectively removing part of said thin film and forming said light sensitive thin film.

10. The method according to claim 1, wherein said semiconductor substrate is heated or exposed to a reduced pressure in the step of removing said solvent from said coating film.

11. A method of manufacturing a semiconductor device comprising:

forming a first thin film on a main surface of a semiconductor substrate having an alignment mark;

supplying a chemical containing a light sensitive material and a solvent to said first thin film to form a coating film on said first thin film;

forming a light sensitive film by removing said solvent contained in said coating film to provide a light sensitive film thereon;

applying a first energy beam to said light sensitive film provided on a region containing said alignment mark, thereby to selectively remove said light sensitive film and part of said first thin film;

recognizing a position of said alignment mark by irradiating said alignment mark with said reference light through the region in which said first thin film is selectively removed;

forming a latent image on said light sensitive film by irradiating a predetermined position of said light sensitive film with a second energy beam based on the position of the recognized alignment mark; and forming a light sensitive film pattern by selectively removing part of said first thin film based on the latent image formed on said light sensitive film, wherein upon irradiating said first energy beam, a liquid is supplied to at least a region irradiated with said first energy beam.

12. The method according to claim 11, wherein, any one selected from distilled water and an organic solvent having transparency to said first energy beam is used as said liquid.

13. The method according to claim 11, wherein, any one selected from oxidizing water, reduced water, alkaline water and acid water, in which at least one of ozone, oxygen, hydrogen, ammonia, carbon dioxide and hydrogen chloride is dissolved, is used as said liquid.

14. The method according to claim 11, wherein ultrasonic wave is applied to said liquid.

15. The method according to claim 11, wherein after part of said first thin film is removed, said semiconductor substrate is heated to remove said liquid left on said main surface.

16. The method according to claim 11, wherein said light sensitive film has one selected from absorption and damping characteristics for said second energy beam.

17. The method according to claim 11, wherein said first thin film reduces the intensity of reflection light of said second energy beam reflected by a lower layer of said light sensitive thin film.

18. The method according to claim 11, wherein as light source of said reference light, the same light source as said second energy beam is used.

19. The method according to claim 11, wherein after a latent image is formed on said light sensitive thin film, at least part of the region in which said first thin film is selectively removed is covered.

20. The method according to claim 11, wherein said semiconductor substrate is heated or exposed to a reduced pressure in the step of removing said solvent from said coating film.

21. A method of manufacturing a semiconductor device comprising:

forming a coating film by supplying a chemical containing a light sensitive material and a solvent onto a main surface of a semiconductor substrate having an alignment mark;

forming a light sensitive thin film on said semiconductor substrate by removing said solvent contained in said coating film;

removing selectively part of said light sensitive thin film by irradiating said light sensitive thin film on a region containing said alignment mark with a first energy beam;

carrying said semiconductor substrate to latent image forming means to irradiate said alignment mark with a reference light through the region in which said light sensitive thin film is selectively removed, thereby recognizing a position of said alignment mark;

forming a latent image on said light sensitive thin film by irradiating a predetermined position of said light sensitive thin film with a second energy beam based on the position of the recognized alignment mark; and forming a light sensitive thin film pattern by removing selectively said light sensitive thin film based on the latent image formed in said light sensitive thin film, wherein upon irradiating said first energy beam, a liquid is supplied to a region irradiated with said first energy beam.

22. The method according to claim 21, wherein, any one selected from distilled water and an organic solvent having transparency to the first energy beam is used as said liquid.

23. The method according to claim 21, wherein, any one selected from oxidizing water, reduced water, alkaline water and acid water, in which at least one of ozone, oxygen, hydrogen, ammonia, carbon dioxide and hydrogen chloride is dissolved, is used as said liquid.

24. The method according to claim 21, wherein ultrasonic wave is applied to said liquid.

25. The method according to claim 21, wherein after part of said coating film is removed, said semiconductor substrate is heated to remove said chemical left on said main surface.

26. The method according to claim 21, wherein said light sensitive thin film has one selected from absorption and damping characteristics for said second energy beam.

27. The method according to claim 21, wherein as a light source of said reference light, the same light source as said second energy beam is used.

28. The method according to claim 21, wherein after a latent image is formed on said light sensitive thin film, at least part of the region in which said first thin film is selectively removed is covered.

29. The method according to claim 21, wherein said semiconductor substrate is heated or exposed to a reduced pressure in the step of removing said solvent from said film coating.

* * * * *